United States Patent
Sturgeon et al.

(10) Patent No.: US 9,413,630 B2
(45) Date of Patent: Aug. 9, 2016

(54) REMOTE ACCESS APPLIANCE HAVING MSS FUNCTIONALITY

(75) Inventors: Donald A. Sturgeon, Huntsville, AL (US); Richard T. Holloway, Huntsville, AL (US); Steven R. Blackwell, Harvest, AL (US)

(73) Assignee: AVOCENT HUNTSVILLE CORP., Huntsville, AL (US)

( * ) Notice: Subject to any disclaimer, the term of this patent is extended or adjusted under 35 U.S.C. 154(b) by 507 days.

(21) Appl. No.: 13/877,517

(22) PCT Filed: Sep. 29, 2011

(86) PCT No.: PCT/US2011/054033
§ 371 (c)(1),
(2), (4) Date: May 9, 2013

(87) PCT Pub. No.: WO2012/047718
PCT Pub. Date: Apr. 12, 2012

(65) Prior Publication Data
US 2013/0219060 A1    Aug. 22, 2013

Related U.S. Application Data

(60) Provisional application No. 61/389,616, filed on Oct. 4, 2010, provisional application No. 61/488,262, filed on May 20, 2011.

(51) Int. Cl.
*G06F 15/173* (2006.01)
*H04L 12/26* (2006.01)
(Continued)

(52) U.S. Cl.
CPC ............... *H04L 43/12* (2013.01); *G06F 1/206* (2013.01); *G06F 1/3203* (2013.01); *G06F 8/24* (2013.01);
(Continued)

(58) Field of Classification Search
USPC .......................... 709/217, 218, 219, 223, 224
See application file for complete search history.

(56) References Cited

U.S. PATENT DOCUMENTS 5,179,376 A * 1/1993 Pomatto ................... 340/870.02
5,406,495 A * 4/1995 Hill ................................ 702/72
(Continued)

FOREIGN PATENT DOCUMENTS

WO    WO-2008/021052 A2    2/2008

OTHER PUBLICATIONS

"OPMA M3-G4 User Manual," Dec. 13, 2007, pp. 1-122, XP55015757, Retrieved from the Internet: URL:http://www.raritan.com/adx/aspx/adxGetMedia.aspx?DocID=aaeebbcf=d653-4805-8178-f59e0f086c3a&MediaID=8309&Filename=OPMA_M3_G4_User_Manual.pdf&1=English [retrieved on Jan. 5, 2012].
(Continued)

*Primary Examiner* — Liangche A Wang
(74) *Attorney, Agent, or Firm* — Harness, Dickey & Pierce, P.L.C.

(57) ABSTRACT

A remote access appliance is disclosed for facilitating communications between a managed device and a user located remotely from the appliance and from the managed device. The appliance may have a processor adapted to facilitate the communication of keyboard, video and mouse information between the appliance and the managed device. A manageability subsystem may be incorporated for communicating with the managed device and collecting information concerning operation of the managed device, without the need to first transmit the information over a network.

18 Claims, 14 Drawing Sheets

(51) Int. Cl.

| | | |
|---|---|---|
| *G06F 1/20* | (2006.01) | |
| *G06F 1/32* | (2006.01) | |
| *G06F 9/44* | (2006.01) | |
| *G06F 11/30* | (2006.01) | |
| *H04L 12/24* | (2006.01) | |
| *H05K 7/14* | (2006.01) | |
| *H04L 12/911* | (2013.01) | |
| *H04L 29/08* | (2006.01) | |
| *G06F 11/34* | (2006.01) | |

(52) U.S. Cl.
CPC ........ *G06F 11/3006* (2013.01); *G06F 11/3062* (2013.01); *G06F 11/3065* (2013.01); *H04L 41/0226* (2013.01); *H04L 47/70* (2013.01); *H04L 67/12* (2013.01); *H04L 67/125* (2013.01); *H05K 7/1498* (2013.01); *G06F 11/3409* (2013.01); *H04L 41/0253* (2013.01); *H04L 41/04* (2013.01); *Y02B 60/1275* (2013.01); *Y02B 60/165* (2013.01)

(56) References Cited

U.S. PATENT DOCUMENTS

| | | | |
|---|---|---|---|
| 5,517,423 A | * | 5/1996 | Pomatto .................... 700/286 |
| 2002/0027495 A1 | * | 3/2002 | Darby et al. ................. 340/298 |
| 2006/0031447 A1 | * | 2/2006 | Holt et al. .................... 709/223 |
| 2006/0174285 A1 | * | 8/2006 | Brady et al. .................. 725/76 |
| 2007/0058657 A1 | | 3/2007 | Holt et al. |
| 2007/0206630 A1 | | 9/2007 | Bird |

OTHER PUBLICATIONS

International Search Report and Written Opinion for PCT/US2011/054033, mailed Jan. 23, 2012; ISA/EP.

* cited by examiner

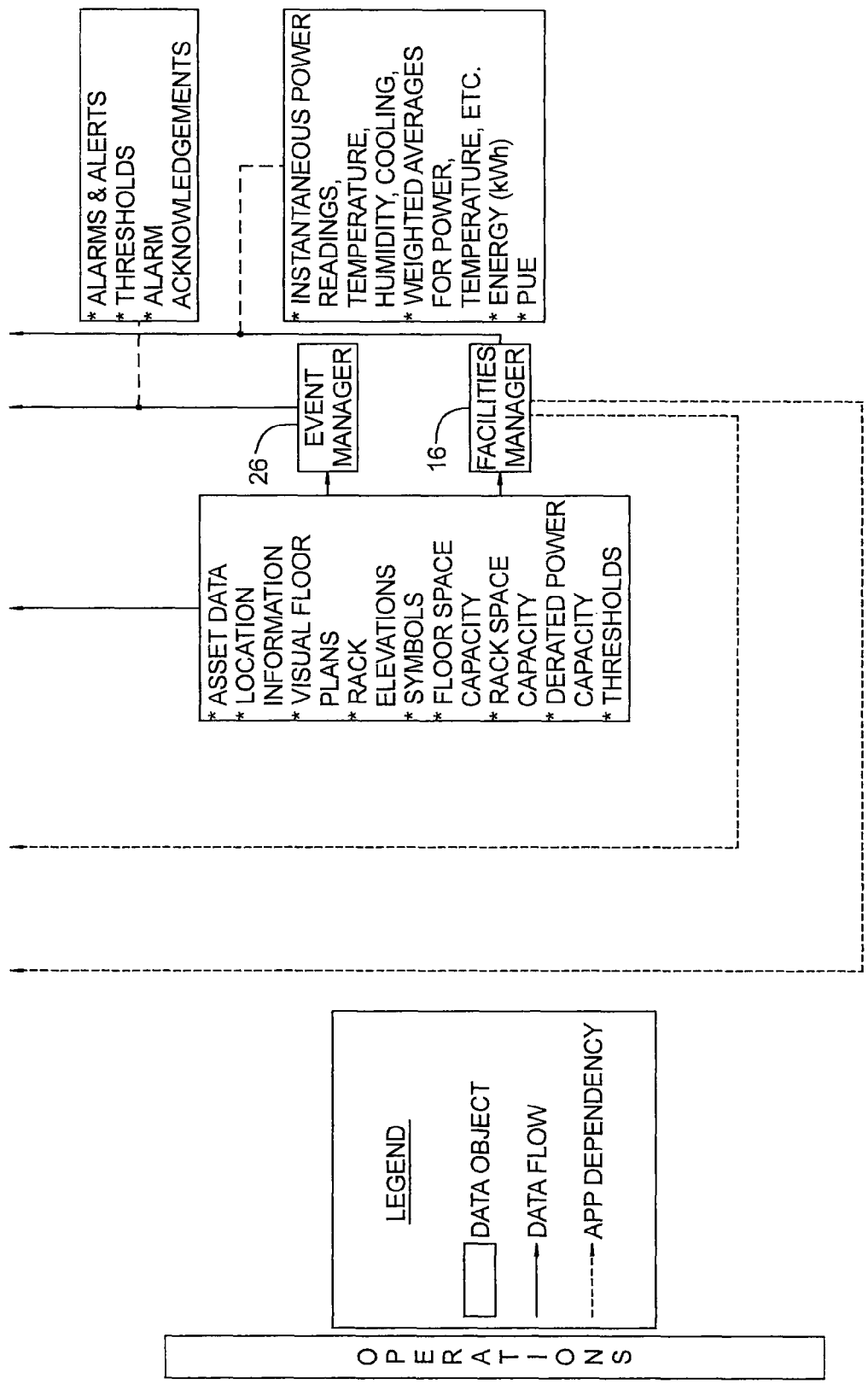

| Interface | Electrical Specification | Physical Connector |
|---|---|---|
| USB | USB 2.0 | USB-A |
| Serial Console | RS-232C | RJ-45 |
| VGA | VESA XGA | DE-15 |
| Power | N/A | IEC-C14 |
| Network Primary | IEEE 802.3 | RJ-45 |
| Network Secondary | IEEE 802.3 | RJ-45 |
| IP (Dedicated) | IEEE 802.3 | RJ-45 |
| Serial (Dedicated) | RS-232C | RJ-45 |
| Autosense IP/Serial | IEEE 802.3/RS-232C | RJ-45 |
| RDU Input Sensor | N/A | RJ-45 |
| RDU 1-Wire/I2C | Maxim 1-Wire/I2C Specification Ver. 2.1 | RJ-45 |
| RDU I/O (E-Link) | RS-485 | RJ-45 |
| RDU Serial | RS-485 | RJ-45 |
| RDU Digital Relay | None | 2X2 Screw Terminal |

FIGURE 13

REMOTE ACCESS APPLIANCE HAVING MSS FUNCTIONALITY

CROSS-REFERENCE TO RELATED APPLICATIONS

This application claims the benefit of U.S. Provisional Application No. 61/389,616 filed on Oct. 4, 2010 and U.S. Provisional Application No. 61/488,262 filed on May 20, 2011. The disclosures of the above applications are incorporated herein by reference.

TECHNICAL FIELD

The present application is directed to systems and methods for managing the infrastructure associated with data centers, and particularly to a system and method for monitoring and managing hardware and software components of a modern day data center in a manner that optimizes the efficient use of the hardware and software components, and which also allows real time reconfiguration of the infrastructure components of the data center to meet changing needs and demands.

BACKGROUND

This section provides background information related to the present disclosure which is not necessarily prior art.

The common data center model has gone through many variations since its origins in mainframe computing. As shown in FIG. 1, from distributed computers, to the client/server model, the utilization of virtualized servers, grid consolidation, and most recently the trend toward utility or "cloud" computing, the demands on data centers are always changing and evolving, and the pace of that evolution is increasing as well.

Modern data centers are undergoing a broad transformation, which encompasses technical innovation, operational improvement, new design principles, changes in the data center supply chain, and changes to the relationship between IT and business. Thus, modern data centers are forming increasingly complex environments with many variables that must be taken into account when considering methods to optimize their efficiency. Along with this transformation comes the issue of energy efficiency and resource management, which will be vital to the success and long-term sustainment of these modern data centers. Currently, there exists a gap in information between the data center infrastructure layer (power, cooling, and space) and the information technology ("IT") infrastructure layer (e.g., computing, storage and communications) which is limiting organizations in optimizing efficiency. One example of the layers that form a typical data center is shown in FIG. 2. The ability to maximize efficiency depends upon being able to collect data from all the different components associated with the data center (i.e., IT and infrastructure), and to present the information in a useful way to the system administrators which enables them to make changes when necessary. This ability has come to be referred to among current professionals as "Data Center Infrastructure Management (DCIM)".

The need for a DCIM solution has been brought to light largely by the increase in consolidation and the associated virtualization, which has exposed the aforementioned gap between the IT layer and the infrastructure layer of a modern day data center, and especially the inefficiencies that this gap creates. The gap also poses a dilemma for data center managers: should they sacrifice efficiency by leaving unused capacity (e.g., electrical power capacity or cooling capacity) as a safety net against overloading, or should they use this capacity and increase efficiency at the risk of failure? One principal goal of the present DCIM system and method is to aid the decision-making process by providing accurate and real-time information to the system administrators in a useful and meaningful way. The bridging of the IT/infrastructure gap is crucial as the demands placed on data centers continue to grow into the future. But up until the present time, no suitable solutions have been proposed which can provide sufficient information to system administrators to accomplish the needed real time management of infrastructure resources to meet the changing needs of the IT layer.

SUMMARY

In one aspect the present disclosure relates to a remote access appliance is disclosed for facilitating communications between a managed device and a user located remotely from the appliance and from the managed device. The appliance may have a processor adapted to facilitate the communication of keyboard, video and mouse information between the appliance and the managed device. A manageability subsystem may be incorporated for communicating with the managed device and collecting information concerning operation of the managed device, without the need to first transmit the information over a network.

In another aspect the present disclosure relates to a remote access appliance for facilitating communications between a managed device and a user located remotely from the appliance and from the managed device. The appliance may comprise a processor adapted to facilitate the communication of keyboard, video and mouse information between the appliance and the managed device. A rack data unit (RDU) subsystem may be included which is adapted to communicate with a plurality of remotely located sensors and to receive sensor data from the remotely located sensors, without the need to transmit the sensor data over a network. A manageability subsystem may also be included for communicating with the managed device and receiving data directly from the managed device.

In still another aspect the present disclosure relates to a method for enabling communications between a managed device and a user located remotely from the managed device. The method may comprise using an appliance with a processor adapted to facilitate the communication of keyboard, video and mouse information between the appliance and the managed device. The method may also include using a manageability subsystem included in the appliance to collect data directly from the managed device for analysis.

In still another aspect the present disclosure relates to a system including a plurality of remote access appliances for facilitating communications between a plurality of managed devices and at least one user located remotely from the appliances and the managed devices. Each appliance may comprise a processor adapted to facilitate the communication of keyboard, video and mouse information between the appliance and at least one managed device in communication with the appliance. Each appliance may further include a manageability subsystem for communicating with the managed device and collecting information concerning operation of the managed device. The manageability subsystem may collect the information without the need to first transmit the information over a network. The appliances of the system may collectively form a distributed manageability subsystem configuration that enables each appliance to contribute to collecting the information from the managed device that it is communicating with.

Further areas of applicability will become apparent from the description provided herein. The description and specific examples in this summary are intended for purposes of illustration only and are not intended to limit the scope of the present disclosure.

BRIEF DESCRIPTION OF DRAWINGS

The drawings described herein are for illustrative purposes only of selected embodiments and not all possible implementations, and are not intended to limit the scope of the present disclosure.

FIG. 13 is a table of information pertaining to each of the interface ports on the DCIM appliance.

Corresponding reference numerals indicate corresponding parts throughout the several views of the drawings.

DETAILED DESCRIPTION

Figure 1:
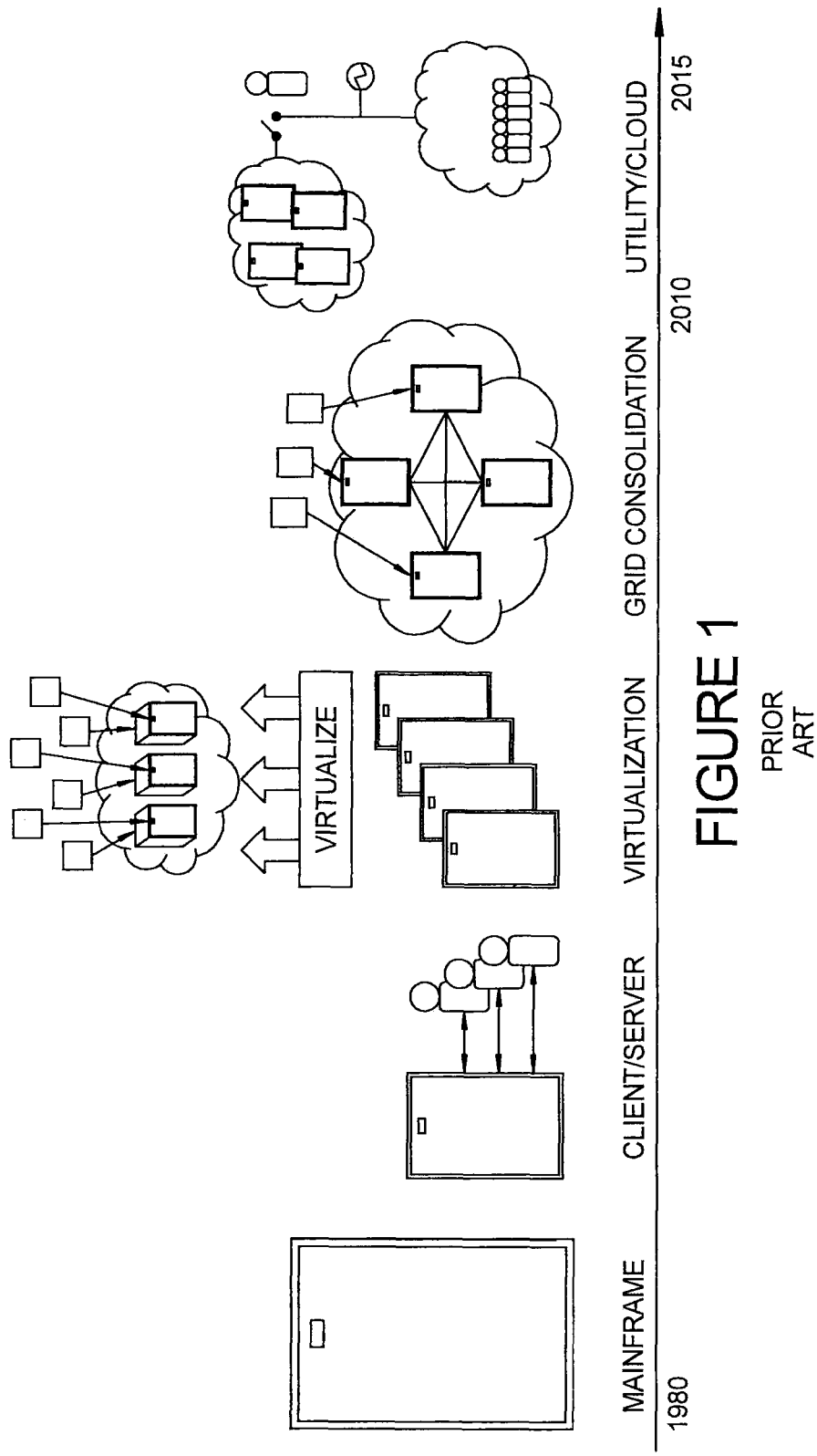
FIG. 1 is a high level representation of changes that the common data center model has progressed through since its origins in mainframe computing.
Figure 2:
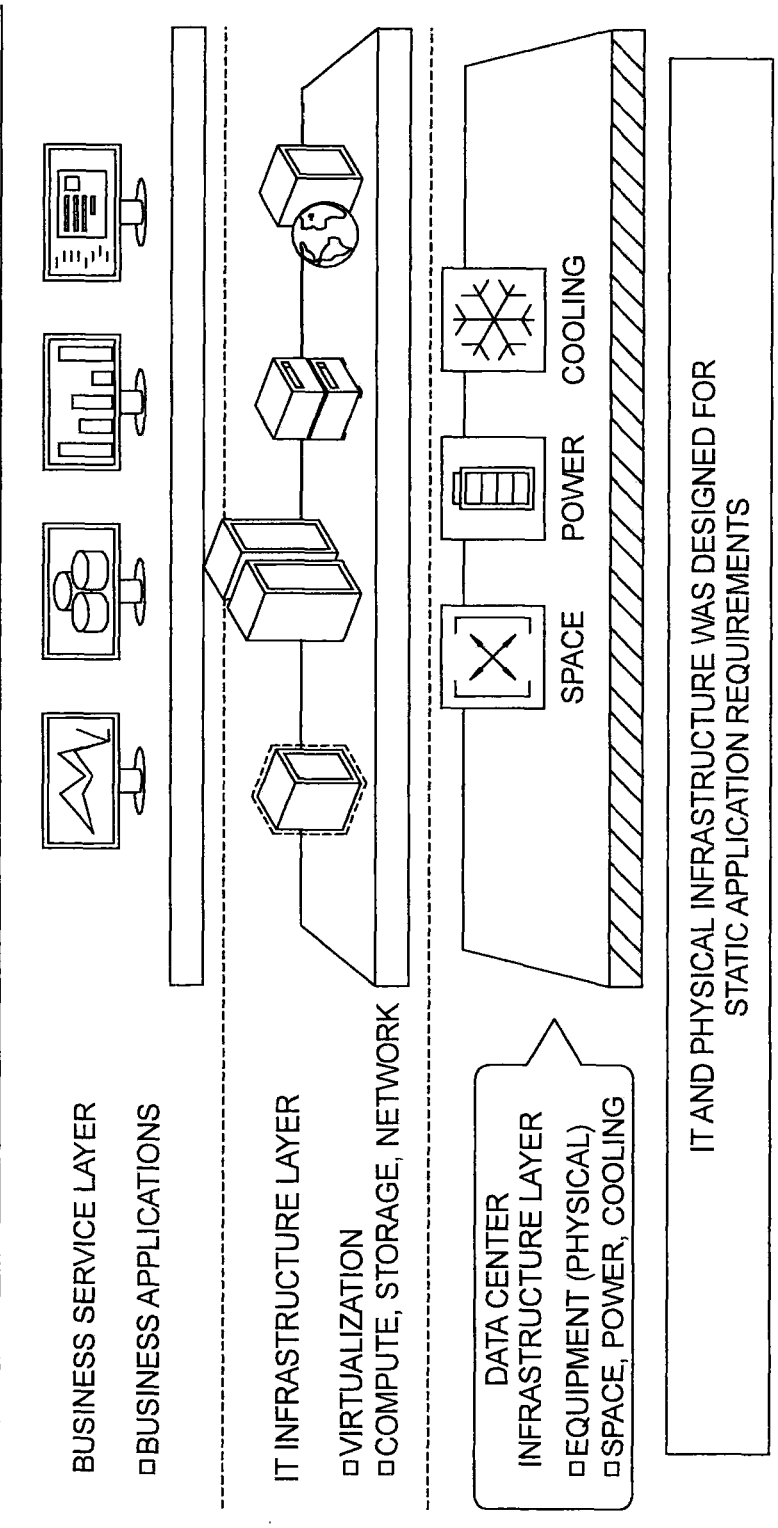
FIG. 2 is a high level representation of one example of the various components that may be used in the various functional layers of a typical existing data center.

The following description is merely exemplary in nature and is not intended to limit the present disclosure, application, or uses. It should be understood that throughout the drawings, corresponding reference numerals indicate like or corresponding parts.

Example embodiments of a Data Center Infrastructure Management (hereinafter "DCIM") Solution 10 will now be described more fully with reference to the accompanying drawings.

Overview

This section provides a general summary of the disclosure, and is not a comprehensive disclosure of its full scope or all of its features. The DCIM Solution 10 is a modularly expandable family of hardware and software products that are designed to manage all the elements of a datacenter from a central location. In particular, the DCIM Solution 10 includes one or more DCIM hardware appliances (hereinafter simply the "DCIM appliances") and a suite of software products (hereinafter the "DCIM Software Suite"). The DCIM Solution has the capability to manage Microsoft Windows® servers, Linux® servers, UNIX® servers, storage and serial devices, service processors, rack/environmental sensors, data center power units, cooling units, and power distribution units (PDUs), with all data being gathered by a common collection engine. It allows data center operators to have full access to monitor and control every piece of equipment in the data center.

Until now, to manage a data center, multiple point solutions have been needed. The DCIM Solution 10 brings all of these point solutions into a single product suite. Previously, a plurality of independent hardware devices have been required, such as remote access application and associated hardware such as Avocent's KVM appliance to manage Windows® servers; the Avocent® Advanced Console Server (ACS) to manage Linux®/UNIX® servers, serial devices and iPDU; the Avocent® MergePoint™ Service Processor Manager; the Liebert® Rack Data Unit (RDU) to manage rack and environmental sensors, and the Liebert® SiteLink™ communications interface. Previously, a plurality of independent software applications have also been typically been required, such as: the Avocent® MergePoint Infrastructure Explorer data center management software; the Liebert® SiteScan Web centralized monitoring and control system; Emerson Network Power ASCO PowerQuest™ power interface software to monitor power and cooling equipment; and the Aperture® Vista enterprise software solution. By consolidating multiple software appliances into the consolidated software platform that forms the DCIM Software Suite of the DCIM Solution 10, and multiple hardware appliances into the aggregated DCIM hardware appliance, the DCIM Solution 10 not only frees up physical space on an equipment rack, but the operator's span of control of the data center is enhanced. This allows the data center manager to even more effectively manage and control servers and other computing/storage devices, power to equipment, and cooling systems to optimize performance and energy usage.

In addition to the obvious benefits that the DCIM appliances provide, the DCIM Software Suite makes managing the datacenter easier and even more efficient than what was previously possible. The software modules that comprise the DCIM Software Suite may run on a common host server apart from the DCIM appliances and may work to provide a complete and accurate view of the data center, while still allowing the user to manage and control every aspect of the data center. The host server receives data from all of the DCIM appliances throughout the data center via their Manageability Subsystem (MSS) collection engines. By using the DCIM Software Suite modules, the data center manager can tap into the real-time data, view reports, and manage the devices remotely from a rich, web-based, graphical user interface ("GUI").

It should also be noted that the DCIM appliances and the DCIM Software Suite can be implemented separately and scaled to fit a user's need. By implementing the DCIM appliances on their own, the user can still access the DCIM appliances remotely, and therefore access the devices connected to them as well. However, the user would not benefit from the reports and enhanced management abilities that the DCIM Software Suite provides. Likewise, the DCIM Software Suite can be implemented in the data center without the DCIM appliances, although without the physical connectivity provided by the DCIM appliances, real-time data collection, monitoring and control are not supported.

DCIM Appliance and DRIP (Hardware)

Figure 3:
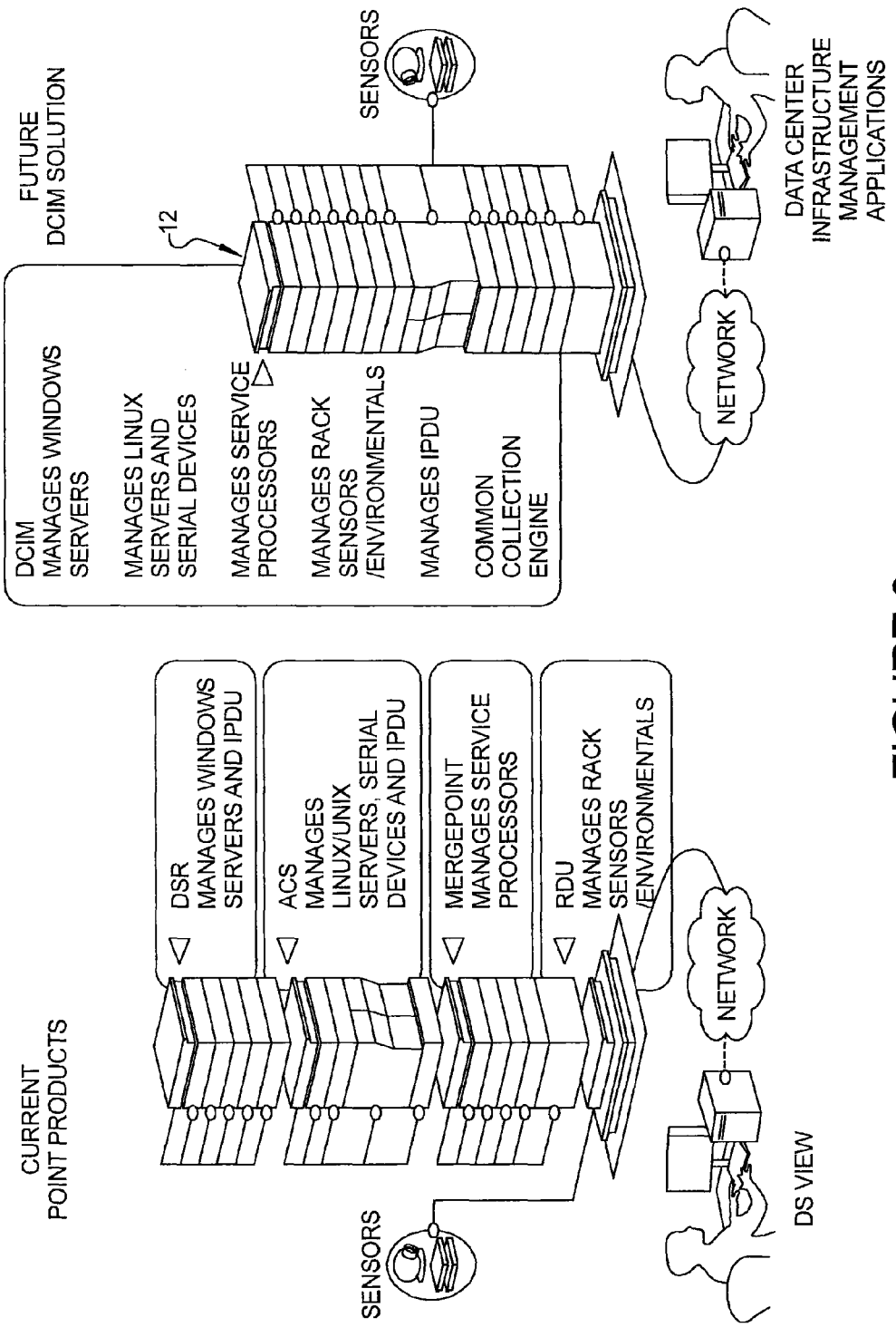
FIG. 3 is a high level representation of one example of a single DCIM Appliance being used to perform the functions of a plurality of hardware devices.

A DCIM appliance 12 may comprise one or more hardware appliances that typically reside in selected equipment racks or that may be mounted on a wall within a datacenter. The arrangement of interfaces on the DCIM appliance 12 provides the user with access to various pieces of equipment for control and performance metric collection. As illustrated in FIG. 3, the single DCIM appliance 12 consolidates the functions of several previous products into one piece of hardware. The DCIM appliance 12 may replace the existing Avocent® DSR® switches, Avocent® Advance Console Server (ACS), MergePoint Service Process Manager, (SPM), and the Liebert® Rack Data Unit (RDU) products, and consolidate all of their functionality into one or more hardware appliances. A base embodiment of the DCIM appliance 12 termed the "DCIM SP" is targeted to replace the existing service process manager (SPM) hardware. The DCIM SP can have two specific port configurations, one with 24 IP ports and another with 40 IP ports. Both versions can include eight dedicated serial ports. For each, the IP ports can be isolated from the network interface ports and function as a layer two switch. This arrangement preserves the configuration of the current SPM. The numerous IP ports and the eight dedicated serial ports provide an appliance that can service an entire rack of service processors and also provide control of serial based switches and power strips in the rack. In addition to the two physical port SPM variants, there is a logical version that has only the main network ports and does not have any rear panel ports, the DCIM SP Logical.

In addition to the DCIM SP embodiment, the DCIM appliance 12 may have three higher-end embodiments labeled the "DCIM Branch 8", the "DCIM Entry", and the "DCIM Enterprise". This higher-end group of embodiments of the DCIM appliance 12 provides auto-sensing ports that can automatically select between IP or serial connections. The DCIM Branch 8 does not have RDU connections while the DCIM Entry and DCIM Enterprise devices do. The RDU interfaces on the DCIM Entry and DCIM Enterprise appliances mimic the main connectivity of the RDU appliance and allow similar functions to be included on the higher-end DCIM devices. The higher-end DCIM appliance 12 embodiments may also have the ability to interface with an IQ module providing traditional KVM functionality. This IQ module, called a "Digital Rack Interface Pod" (DRIP), provides digitization of analog video along with keyboard and mouse control and virtual media access.

The key functions of the DRIP are:
Providing USB and PS/2 ports for device keyboard and mouse;
Digitizing analog video data and sending it to the DCIM appliance 12;
Connecting to a server's Service Processor for transmitting IPMI data to the DCIM appliance 12;
Enable access to virtual media; and
Enable Smart Card support.

In order to support the various hardware platforms, an appliance host software platform is provided. The appliance host platform may be based on the Linux® vServer patch and functions as an OS virtualized platform. This allows Linux® operating system based applications to run with minimal changes on top of the DCIM appliance 12 host platform. Building the DCIM appliance 12 in this manner minimizes the changes necessary to combine the individual technologies into a single appliance. It also facilitates groups being able to concentrate on their core function without needing to know the details of the DCIM appliance 12 host platform.

A highly desirable feature of the DCIM appliance 12 software architecture is that it makes the finished devices look like a single cohesive appliance, even though they may be constructed from several underlying disparate software applications. To achieve this, the host system may be set up to provide several system functions that provide a gateway between the external user and the internal guest applications. These include licensing, authentication, authorization and auditing (AAA), and user interfaces. These functions take the external input and map it on to the correct application without the user requiring any knowledge of the underlying architecture. For example when a user authenticates to the DCIM appliance 12 the AAA function may inform each of the guest applications that the user is valid. The user does not need to authenticate to each guest application. Additional host pieces may include things such as the Linux® kernel, base file system and hardware component driver support. Each of the DCIM appliance 12 may also host a manageability subsystem (MSS) software engine (to be discussed in connection with FIG. 5).

In summary, the six different configurations for two DCIM platforms, platforms "A" and "B", are shown in the following table.

|  | Platform | | | | | |
| --- | --- | --- | --- | --- | --- | --- |
| Function | DCIM SP I | DCIM SP II | DCIM SP Logical | DCIM Branch 8 | DCIM Entry | DCIM Enterprise |
| Com Express | Atom D410 | Atom D410 | Atom D410 | Atom D410 | Atom D410 | I7-620LE |
| Memory | 4 GB DDR2 | 4 GB DDR2 | 4 GB DDR2 | 4 GB DDR2 | 4 GB DDR2 | 8 GB DDR3 |
| HDD | 250 GB | 250 GB | 250 GB | 250 GB | 250 GB | Dual 2TB |
| Dedicated IP Ports | 24 | 40 | 0 | 0 | 0 | 0 |
| Dedicated Serial Ports | 8 | 8 | 0 | 0 | 0 | 0 |
| Autosensing Ports | 0 | 0 | 0 | 8 | 32 | 40 |
| RDU Functions | None | None | None | E-Link and RS-485 | All | All |
| MSS Features | Yes | Yes | Yes | Yes | Yes | Yes |
| Power Supply Wattage | 125 W | 125 W | 125 W | 125 W | 125 W | 125 W |
| Power Configuration | Single/Dual | Single/Dual | Single/Dual | Single | Single/Dual | Single/Dual |
| Enclosure | Shallow | Shallow | Shallow | Extended | Extended | Extended |

DCIM Software Suite

Figure 4A:
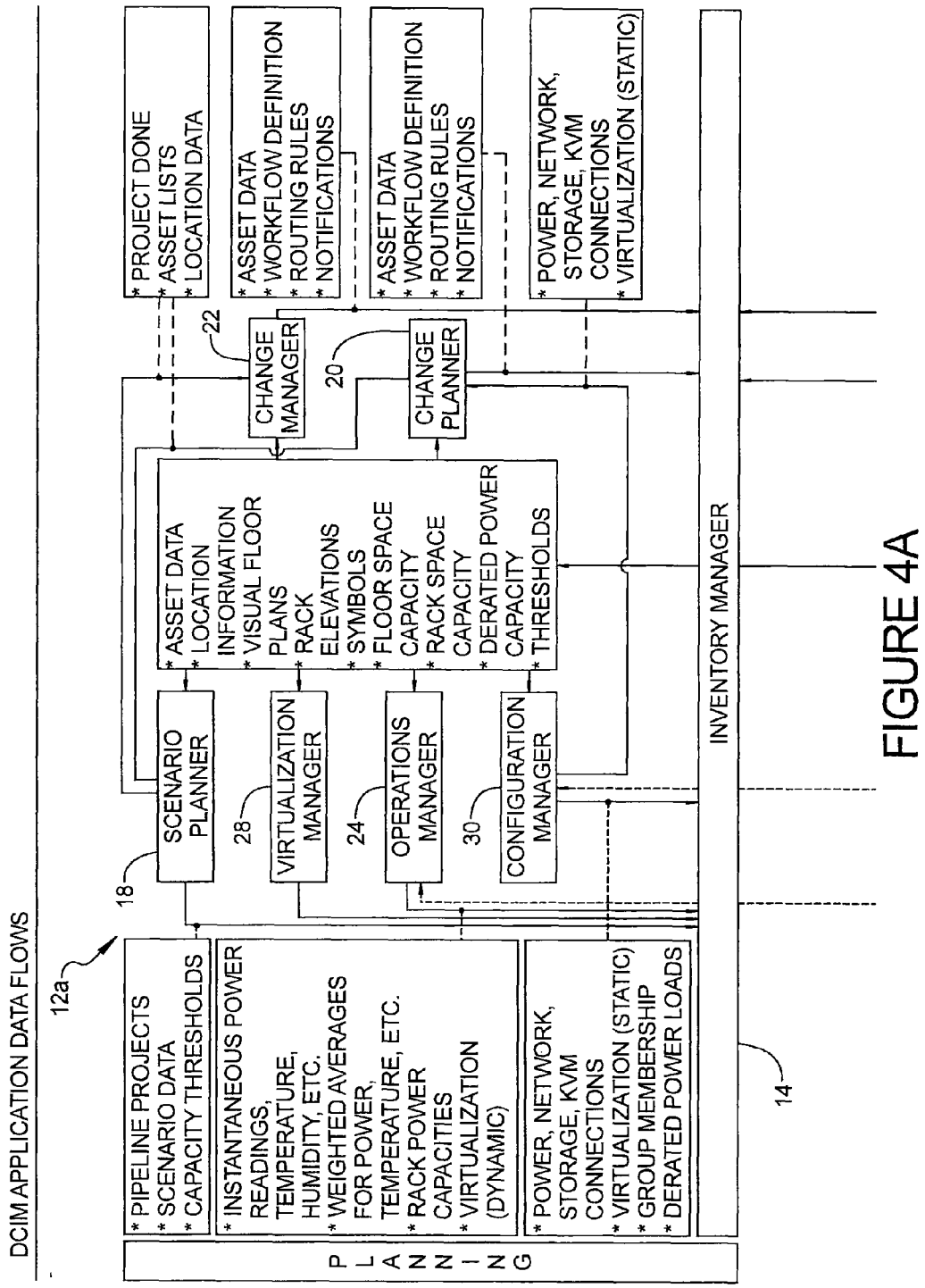
FIG. 4 is a high level diagram of exemplary modules that may be used to form the DCIM Software Suite.

A DCIM Software Suite 12a of modules is modular, expandable and designed to make the operation, management, configuration or expansion of a datacenter seamless and simple. One example of the DCIM Software Suite 12a of modules is shown in FIG. 4 and may include: an Inventory Manager 14, a Facilities Manager 16, a Scenario Planner 18, a Change Planner 20, a Change Manager 22, an Operations Manager 24, an Event Monitor 26, a Virtualization Manager 28 (and potentially a Rack Power Manager, and a Configuration Manager 30). These modules integrate seamlessly with one another and to provide a rich user interface, with the ability to drag and drop items, show high-fidelity images of assets and reported data, and compile user-specific views with combinations of available facilities.

The DCIM Software Suite 12a is flexible enough to accommodate the preferences of the system administrator in a number of different areas, from the operating system and database to the web browser interface. The software modules can be installed on Microsoft® servers, Linux® servers, or Sun® servers, and possibly on other brands of servers. Microsoft® SQL and Oracle® databases are supported. To access the software modules, various commercially available operation systems and web browsers are supported.

For administrators who use existing products of Emerson Network Power or the Avocent® Corporation, for example the Aperture® Vista® data center resource management system, the Liebert® Site Scan® centralized monitoring and control system, or Avocent® MergePoint™ Infrastructure Explorer software (AMIE), the DCIM Software Suite 12a supports the migration of data. This data may include all assets and plan data, associated projects, and symbols libraries. The import may be manually triggered but will not necessitate the manual mapping of any asset, placement, plan or project data from AMIE to the modules of the DCIM Software Suite. The individual DCIM Software Suite 12a software modules are described in detail in the pages to follow.

DCIM Inventory Manager Module 14

The Inventory Manager module 14 manages DCIM records, which constitute the data center inventory of equipment. Often, data center managers and site technicians manage equipment lists through a variety of means such as spreadsheets, documents, drawing files, finance systems, bills of lading, etc. These are not ideal methods, and tend to be ad-hoc in format, inaccurate, and frequently out-of-date. They also do not provide timely access to information about where physical equipment is located and its purpose. The DCIM Inventory Manager module 14 replaces all of these ad-hoc methods with a system that gives a clear picture of the entire inventory of the data center, with equipment counts of IT assets such as servers and switches, and critical infrastructure equipment like power distribution units ("PDUs") and uninterruptible power supplies ("UPSs"). It allows users to quickly see where equipment is located and gives a gross total of power and space usage.

To do this, the DCIM Inventory Manager module 14 may rely on import software capabilities and specialized views, for example: 1) Import capability to extract equipment records from various sources, and combine information from these sources into a complete data set; 2) Geography Views, which allow users to provide the global location of data center installations and drill down to show more detailed location views, such as campus views, regional views, pictures of buildings, etc.; 3) Textual and Graphical Inventory Lists, which are textual views for "placed" and "un-placed" inventory (items which have not been assigned a location); 4) Data Center Portfolio View, which lists the data centers being managed by the system; 5) Floor Plans and Elevation Views for "placed" inventory (items which have been assigned a location); 6) Workspaces, which allow users to combine graphic and data elements from other views to give them a "dashboard" of critical information which they can reference at a moment's notice; and 7) Layers, which allow users to see information from other applications within the Inventory Manager graphic drawings.

The DCIM Inventory Manager module 14 is able to create, update, and delete all represented objects. These objects include:

IT Spaces—areas where IT equipment is located and housed, and at a more granular level, where equipment is installed.

Floors—areas which contain one or many data center spaces, and correlate to a floor in a building.

Data Centers—areas that are designed to house and run IT equipment. Typical data centers have raised floor spaces as well as dedicated power and cooling equipment.

Spaces—regions of a data center floor in which IT equipment is directly installed. Typical data center spaces have raised floors and racks to house equipment, and are secured from unauthorized entry.

Zones—geographic areas of the data center as defined by the customer, which allow the tabulation of capacity and resource usage within areas of the overall data center. In our definition, a zone is one contiguous space within the data center floor.

Other spaces (walkways, free space)—spaces which, when deducted from the total data center space allow for the calculation of usable data center space.

Enterprise—Information about the Enterprise is tracked to give context for the entire data center portfolio and the teams that manage them. Enterprise information may be tracked at the global level in the software.

IT Equipment—may include all equipment used for the direct purpose of data processing, communications, and storage, and the equipment used to house them. This includes: racks, benches, shelves, data closets; servers, network appliances; symbols, placeholders; and sensor equipment.

Critical Infrastructure—may include all devices, which support the cooling and power distribution for the data center space, including: local utility entrance meters, surge protection devices, transformers, switchgears (HV/MV/LV), generators, uninterruptible power supplies (UPSs), energy storage devices & systems (e.g. batteries, flywheels, fuel cells), power disconnects (e.g. circuit breakers, switches/powerties), static transfer switches, floor mount PDU systems, power panels, remote power panels, busway power distribution, commando sockets, rack PDU, solar arrays, cooling towers, chillers, pumps, economizers (water/air), floor mount CRAC, in-row CRAC, condensers, heat exchangers, and water reservoirs (tanks).

DCIM Configuration Manager Module 30

The DCIM Configuration Manager module 30 expands the management of DCIM records that are provided by the DCIM Inventory Manager module 14. The DCIM Configuration Manager module 30 consumes the capabilities of the DCIM Inventory Manager module 14, extending them to manage relationships between chosen assets. These relationships may include, without limitation, connections, logical groups and redundancies. To do this, the DCIM Configuration Manager module 30 may incorporate various features, such as:

Connection Views, which allow users to details of the connections between any placed assets. This may include topology, end-to-end trace, dependency and redundancy;

Panel Schedules, which allow users to view details of a panel and the breakers within that panel;

Alerting capabilities, which allow a user to specify a threshold for a plan, group or assets and alert on the consumption against that threshold;

Customizable views, which allow a user to customize the views of the application data that they would like to use and navigate; and Web Services Interface, which allows a user to manipulate the application data from an external software entity.

DCIM Facilities Manager Module 16

The DCIM Facilities Manager module 16 provides complete performance utilization and event management capabilities for critical infrastructure equipment. It provides realistic, virtual views of the equipment and racks on the data center floor and surrounding equipment rooms, as well as underlying electrical one-line schematics of the power system and piping and instrumentation diagrams of the cooling system. It may also provide equipment maintenance features to assist in maintenance tracking, scheduling and equipment commissioning. By providing a system view of power and cooling infrastructure as designed, the DCIM Facilities Manager module 16 allows the user to view the power consumption and cooling capacity (both in-use and stranded) of each device, or at the system level. In addition, it lets the user reserve blocks of load on the power and cooling systems, and project the power and cooling capacity needs into the future, based on historic capacity use.

The Facilities Manager module 16 may provide, both textually and graphically, a number of useful views that allow the user to better understand and manage the data center infrastructure. The DCIM Facilities Manager module 16 may display floor plans, electrical diagrams, air distribution, and piping and instrumentation diagrams. The DCIM Facilities Manager module 16 may provide real-time performance status of individual elements or groups of infrastructure equipment. Each item in the diagram allows the user to initiate the following actions or control operations, if supported by the equipment:

Turn on/off the specific piece of equipment/device (if applicable);

Change user configurable items (e.g. set-points, labels); and

View detailed information for each piece of equipment/device.

In addition to primary view diagrams, the DCIM Facilities Manager module 16 may have at least three separate dashboard views to give the user an overall picture of real time operations in the data center infrastructure. An "Industry Efficiency Dashboard" may display the standard efficiency metrics of the data center's energy consumption (e.g. PUE/DCiE). A "Utilities Consumption Dashboard" may display the total power load (kW), total cooling load, water consumption if applicable, and the overall utilities cost. A "Capacity Dashboard" may display a breakdown of the aggregated capacity of the data center equipment per type (e.g. the current capacity of all floor mount PDUs), as well as a breakdown of the stranded capacity of the data center power and cooling systems.

The DCIM Facilities Manager module 16 also provides significant scalability, for example (or possibly more) supporting up to 5000 critical infrastructure equipment and instrumentation devices, with an to approximate number of 200 data points each. The equipment data (all parameters other than events) may also be polled at a minimum of every five minutes. Some examples of this data may include temperature, percentage load of a UPS, and circuit breaker state just to name a few example metrics.

Scenario Planner Module 18

The DCIM Scenario Planner module 18 provides the ability to build and compare cost effective scenarios of future resource usage in the data center. It may utilize information from data center infrastructure management applications and real world measurements to map an accurate history of resource usage, and project future trends of growth and decline. With the DCIM Scenario Planner module 18, data center managers and capacity planners can determine the best course of action. Whether it means that installations should be decommissioned and consolidated, or new installations be built, the DCIM Scenario Planner module 18 allows the customer to compare and contrast different scenarios of future data center use. The effect of technology updates, increased density within the data center space, upgrades of the critical infrastructure for more efficient energy use, and gauging demand on IT can be compared to build a plan of action that meets service levels at the lowest possible cost. Once the course of action has been determined, the DCIM Scenario Planner module 18 assists in the communication of the plan to management. Software Capabilities that may be included in DCIM Scenario Planner module 18 include, without limitation, one or more of the following:

The ability to collect and understand past trends of aggregated global data center infrastructure resources;

The ability to project past aggregated usage trends into the future, to predict base infrastructure needs globally;

The ability to conduct "what-if" scenario planning for infrastructure needs, and to assess the impact of data center moves, adds, decommissions and consolidations; and The ability to establish a workflow process for project pipeline management, including refinements by technical experts and system owners, and approvals by business managers.

DCIM Change Planner Module 20

The DCIM Change Planner module 20 allows the users to plan and execute changes in the data center infrastructure. To do this, the DCIM Change Planner module 20 may rely on:

Plan views, allowing users to see details of the planned projects;

Timelines, allowing users to see changes planned for a chosen asset throughout the project; and Alerting capabilities, allowing users to be notified when a task is completed.

The DCIM Change Planner module 20 allows the user to create any number of projects, manage those projects and navigate through them. The user can assign a name, tag, description, target completion date and owner to the project, and can assign individual tasks to the project as well. Once a project has been created its details may be visualized in a calendar format with further details made available for any selected project or tasks. The project can be edited by moving project dates, deleting tasks or adding tasks and the project can be deleted. In addition to specific tasks, the user can assign generic tasks, which do not relate to any particular placed asset in the module. The DCIM Change Planner module 20 also allows the user to assign and view dependencies to other tasks in the project. With the capability to create and manage multiple projects, the possibility arises that there may be conflicts between projects, but the DCIM Change Planner module 20 allows the user to view the conflicts and their severity, and resolve the conflict by changing the parameters of the projects.

Once a project is created and tasks assigned, the DCIM Change Planner module 20 allows the user to view a timeline of the project along with visualizations of the changes associated with any assets affected by the project. The user can see a view of the chosen asset (e.g. a rack), with the assets shown in its various states of change that are scheduled to happen during the lifespan of the project. The DCIM Change Planner module 20 may also display a view of the work to be carried out during a project, colorized by chosen dates, which allows a timeline to show the IT person what is happening on a given date for any chosen assets.

For a given project, the DCIM Change Planner module 20 also allows the user to record all project activity and notify any affected personnel of the activity. A user is notified via email once their designated task or project has been created, edited, has a conflict or is tagged as completed. In addition, the user can create customized reports, import project information in a standard format from an external source, and export project information to PDF or spreadsheet for external use.

DCIM Change Manager Module 22

The DCIM Change Manager module 22 expands the planning and execution capabilities of the DCIM Change Planner module 20 to impose predefined processes or workflows on projects and communicate progress and decisions to project members. To do this, the DCIM Change Manager module 22 may rely on the following software capabilities and specialized views:

- Template Workflow Processes that allow a workflow designer to design and publish workflow processes to be used by future projects.
- Interaction with DCIM modules, which allows the workflow process to interact with DCIM modules to verify that certain required actions have been completed.
- Supports integration with third party IT systems to allow a designer to configure an interface to allow an external source to interrogate the application data and initiate workflow processes.
- Human Interaction in a workflow process, which allows a user to interact with a process that was created from a template.

The DCIM Change Manager module 22 provides the ability to create a project template with user defined high level actions supported by lower level tasks provided by the DCIM Change Planner module 20. Project templates may be used to create projects when needed, where the project may follow the template pre-defined steps to completion. A template may contain, without limitation:

- Pre-defined high level tasks related to the installed Inventory Manager modules (e.g. "Move server" or "Add connection").
- User-defined task categories (e.g. "Move", "Add").
- Trigger points to existing workflow templates.

Once a template is created the user can assign roles for use in the template. The user assigns a name, description, and tag to a role, and can assign other users. The DCIM Change Manager module 22 allows for users to be assigned to multiple roles if necessary. In addition to roles, users can create workflow procedures and assign a name, description and tag to each workflow. Once a workflow is created, steps can be added (whether user defined, or predefined) and specific users or roles can be assigned to each step. To add further detail, the user can define rules, such as entry and exit criteria, to each step. Steps may be linked together to define a progression and sub-processes can be created through certain steps.

Once the user has a workflow set up, he/she can simulate a "run" of the execution to identify any errors and validate the workflow. The user may also want to set up customized notifications for various workflow events. The DCIM Change Manager module 22 allows the user to do this, and will propagate notifications to the participants when a task begins, completes, or when any other workflow event occurs.

DCIM Operations Manager Module 24

The DCIM Operations Manager module 24 combines real-world information with managing the data center infrastructure configuration. It provides interfaces to measure performance and utilization across the data center infrastructure and to reveal current available headroom in racks such that the appropriate placement of equipment can be achieved. The DCIM Operations Manager Module 24 may connect to real time data feeds (for power and temperature) from the MSS service to compare and validate the performance guidelines and design criteria established in the Configuration Manager module 30 capabilities.

The DCIM Operations Manager module 24 may also be used to optimize power, cooling, and space capacity to bring about overall optimization of data center infrastructure resources. The business problem this module solves is around the management of power and cooling. Large buffers of power and cooling are typically maintained by data center managers to protect systems from outage due to power spikes and periods of increased usage. The amount of buffer to reserve is typically not managed efficiently. Reduction of these buffers allows better utilization of resources. For example, more equipment may be located in one or more equipment racks while sufficient power and cooling needs are still met for all equipment items.

One important feature of this product is that it provides a natural and elegant approach to viewing monitored information about the data center—of which there is a large amount generated by many systems in many different formats. The result of crunching all of this data and seeing it in a usable form makes possible a more accurate understanding of the operation of the data center environment, a better understanding of the true cost of energy use, maximization of the investment in the data center, and ensuring continued 24/7 operations for IT.

The software capabilities are inherited from those defined for the DCIM Configuration Manager module 30 and the DCIM Inventory Manager module 14. The DCIM Operations Manager module 24 adds new features to the DCIM Configuration Manager module 30 capabilities as listed herein. There may be, however, additional software facilities defined for the DCIM Operations Manager module 24 such as, without limitation:

- Dashboard for monitoring real-time data feed.
- Additional visualizations to show temperature sensor output, and cooling parameters such as airflow.

DCIM Event Monitor Module 26

The DCIM Event Monitor module 26 provides an easy-to-understand system for managing alarms. It provides a single, unified view to monitor alarms for critical infrastructure equipment across the user's entire enterprise. Relevant information is presented in a simple, graphical manner, making it easy to understand and respond quickly. The DCIM Event Monitor module 26 allows the user to, without limitation:

- Maintain service level agreements (SLA's).
- Keep the business critical IT infrastructure available and online.
- Maintain critical infrastructure system redundancy.
- Acknowledge and verify that actions have taken place.

DCIM Virtualization Manager Module 28

The DCIM Virtualization Manager module 28 provides tools to manage virtual infrastructure in a data center. It helps to map physical machines with virtual machines, manage the virtual machines and group the virtual machines for ease of management. The DCIM Virtualization Manager module 28 may relay the information to the DCIM Operations Manager module 24 for interfacing with virtualization management servers (e.g. VMware Virtual Center Management Server). The DCIM Operations Manager module 24 may then auto-discover host machines and virtual machines, relaying this information back to the DCIM Virtualization Manager module 28. With this information the user is able to specify the synchronization schedule of virtualization infrastructure information between virtualization management and virtualization management servers on periodic, pre-defined time intervals. The user may also initiate synchronization on a demand basis from the DCIM Virtualization Manager module 28.

With the virtualization inventory synchronized, the user is able to view the inventory in a graphical format. The DCIM Virtualization Manager module 28 may depict the virtual machines graphically against the physical inventory or servers to show which virtual machines are housed where. In addition, the DCIM Virtualization Manager module 28 may provide a cluster view (showing the groups of virtual machines in various clusters), a virtual list of servers with associated virtual machines, and a search feature allowing the user to find the specific virtual machine, cluster or server that he/she wants to manage. When the user selects the correct virtual machine, the Virtualization Manager module 28 provides the ability to access the virtual machine console by launching the virtualization provider's Remote Console, a Web browser or a RDP from a virtual machine.

Additional Details of DCIM Solution 10

Figure 5:
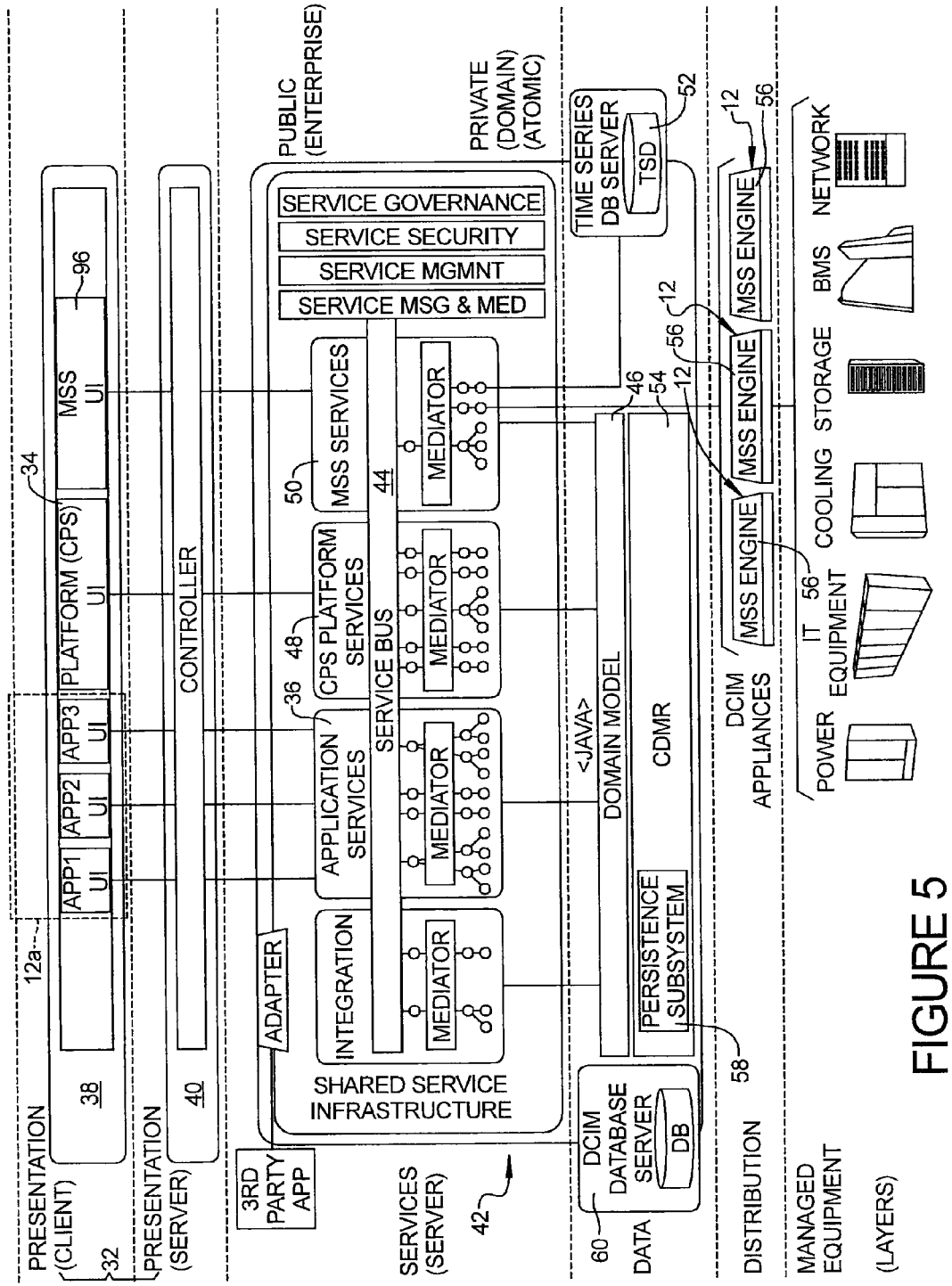
FIG. 5 is a high level diagram of the DCIM Solution architecture.

Referring to FIG. 5, various components of the DCIM Solution 10 can be seen. The architecture of the DCIM Solution 10 contains the following high level components. Each component will be described in more detail in the discussion below.

Presentation UI 32—

These components represent the human interface for individual applications and for the platform. A Common Platform 34 contains a web-based Console Framework that allows individual applications and the platform to plug-in user interface components. The Presentation UI 32 consumes public interfaces exposed by a Services layer 36 that provide the actual business functionality. Logically, the Presentation UI 32 may be broken into two layers: a client layer 38, typically resident within a web browser and representing the "View" in a Model-View-Controller architecture, and a server layer 40, typically representing the Controller.

Enterprise Service Bus (ESB)—

An ENP Common Platform 42 contains an Enterprise Service Bus 414 that provides a container for Business Services and provides for intelligent routing of messages between services. The architecture presumes that communications between the Presentation UI 32 layer (specifically, the controller 40) and the ESB 44 will be SOAP/HTTP, although other transports may be used based on specific application design requirements.

Application Services 36—

These may be individual and/or composite services that provide product application functionality. A service composition is an aggregate of services collectively composed to automate a particular task or business process. These services 36 can be made up of both private and public services. Public services are exposed on the ESB 44 and available for other applications to consume. These application services 36 may use a Domain Model 46 (for example via Java) to access business objects specific to the product domain.

Common Platform Services 48—

These are utility services provided as part of the ENP Common Platform 42 and may be either individual or composite services. The ENP Common Platform 42 provides these services which are likely to be used by any product and may include services such as authentication, authorization and auditing. These services are configurable such that a Product Line Architecture PLA may select which services to include for a given PLA. For maximum extensibility, these services should be data driven such that they are also extensible by adding domain specific knowledge (e.g. a new event type unique to a given domain).

MSS Services 50—

These are composite services that provide for management (e.g. Discovery, Data Acquisition, Command & Control) of managed elements (or managed devices) via a distributed real-time framework. MMS (Manageability Subsystem) Services 50 interacts with the DCIM appliances 12 to perform data acquisition and store acquired data in a Time Series Database 52 and a Common Data Model Repository CDMR 54.

Time Series Database (TSD) 52—

The time-series database 52 operates to persist telemetry data sent from the MMS Services 50.

DCIM Appliance 12—

The DCIM appliance 12 (or appliances 12) form a hardware appliance that is the touch point to the managed equipment or managed devices. Each DCIM appliance 12 can be loaded with several software applications including KVM, Serial, Service Processor and an "MSS Engine" 56 for data acquisition.

MSS Engine 56—

The MSS Engine 56 may be a software component that can be deployed on each DCIM appliance 12 to acquire metric data and perform management (e.g. Discovery, Data Acquisition, Command & Control) on managed equipment being handled by each DCIM appliance 12. The MSS Engine 56 feeds data to the MSS Services 50 for storage in the Time Series Database 52 and the CDMR 54.

Managed Equipment (or Managed Devices or Managed Components)—

Represents an entity (e.g. a "device") that is addressable and can be managed (i.e., controlled in some way) and/or monitored.

Domain Model 46—

The Domain Model 46 provides a common definition of domain concepts across all applications (e.g. a shared, extensible library of domain classes that allow for application specific customization). In one example, the Domain Model 46 may be represented as native Java objects. It also delegates manageability knobs and dials type operations to the MSS Services 50.

Common Data Model Repository (CDMR) 54—

The CDMR 54 forms a repository that is responsible for creating and persisting the Domain Model objects. The CDMR 54 hides the complexity of initializing domain objects and hides a persistence subsystem 58.

DCIM Datastore 60—

A DCIM Datastore 60 may be a SQL database that persists the defined domain objects and other configuration information associated with these domain objects. The DCIM Datastore 60 may be in communication with the persistence subsystem 58.

Integration Services 62—

Composite services that are deployed to support integration with 3$^{rd}$ Party Applications.

3$^{rd}$ Party Applications—

External applications that can be integrated with the ENP Common Platform 42 (e.g., Hewlett-Packard OpenView software, CiscoWorks LAN management solution tools, the EMC Corporation EMC Smarts Application Discovery Manager (ADM)).

Technology Alliances—development of key technology alliances (internal to Emerson and external) to tightly integrate and enable a closed loop control system. Technical alliances with:

Emerson Network Power Products: Liebert Power and Cooling products to embed DCIM components to within managed devices and elements allow discovery, monitoring and control of various Liebert products.

External technology alliances (for example: Cisco, EMC and Vmware to embed DCIM components in managed devices and elements to provide detailed information on server workloads and integrate Power & Cooling consumption.

All components can be deployed on the same server, but the DCIM Solution 10 is flexible enough to allow major components to be placed on separate servers (e.g. Client, Application Server, Database Server, Report Server, etc.) for scalability and redundancy purposes.

The following is a further discussion of various components of the DCIM Solution 10.

Domain Model/CDMR

Figure 6:
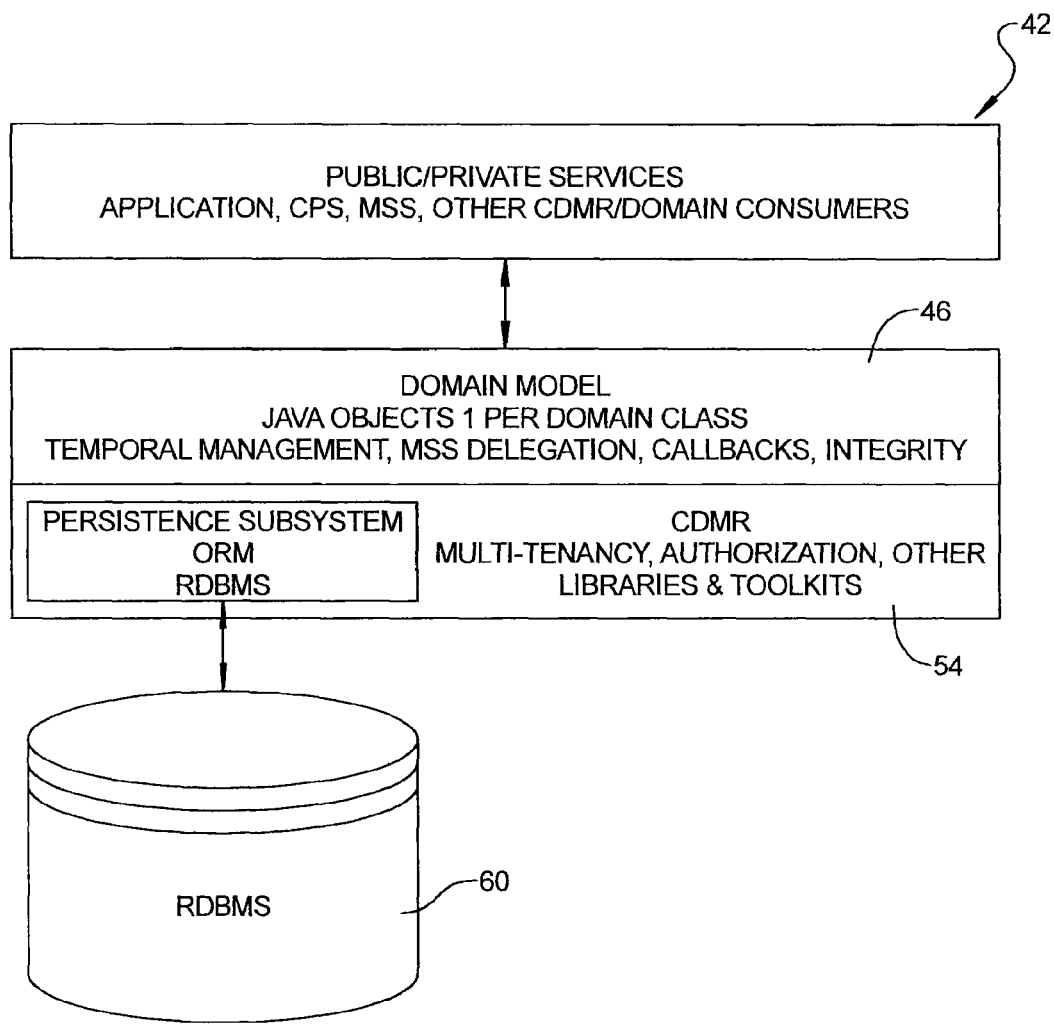
FIG. 6 is a high level diagram of showing the relationship between the Public/Private services and the Domain model and CDMR.

Referring to FIG. 6, the Domain Model 46 may be viewed as a collection of Java classes that represent data center infrastructure entities—and the context in which those entities exist. In addition, the Domain Model 46 may represent users, software licenses and other associated data center infrastructure management (DCIM) entities. These can be viewed as the "facts". These facts are used by applications and services.

A common data model may be shared across all of the DCIM application modules 14-30. Individual products often extend the DCIM product line's shared, common data model. The CDMR 54 maps Java class instances to persistent storage (in a relational database, such as the DCIM datastore 60), enforces authorization, segregates tenants, checks integrity constraints, etc. A variety of cross-cutting concerns can be addressed by the CDMR.

The Domain Model 46 is the collection of domain classes used to represent entities (under management), relationships amongst entities, and policies about entities and so on. The Domain Model 46 establishes the conventions for representing all of the known 'facts' within the DCIM domain. Then, these 'facts' are shared across all products within the DCIM product line.

Figure 7:
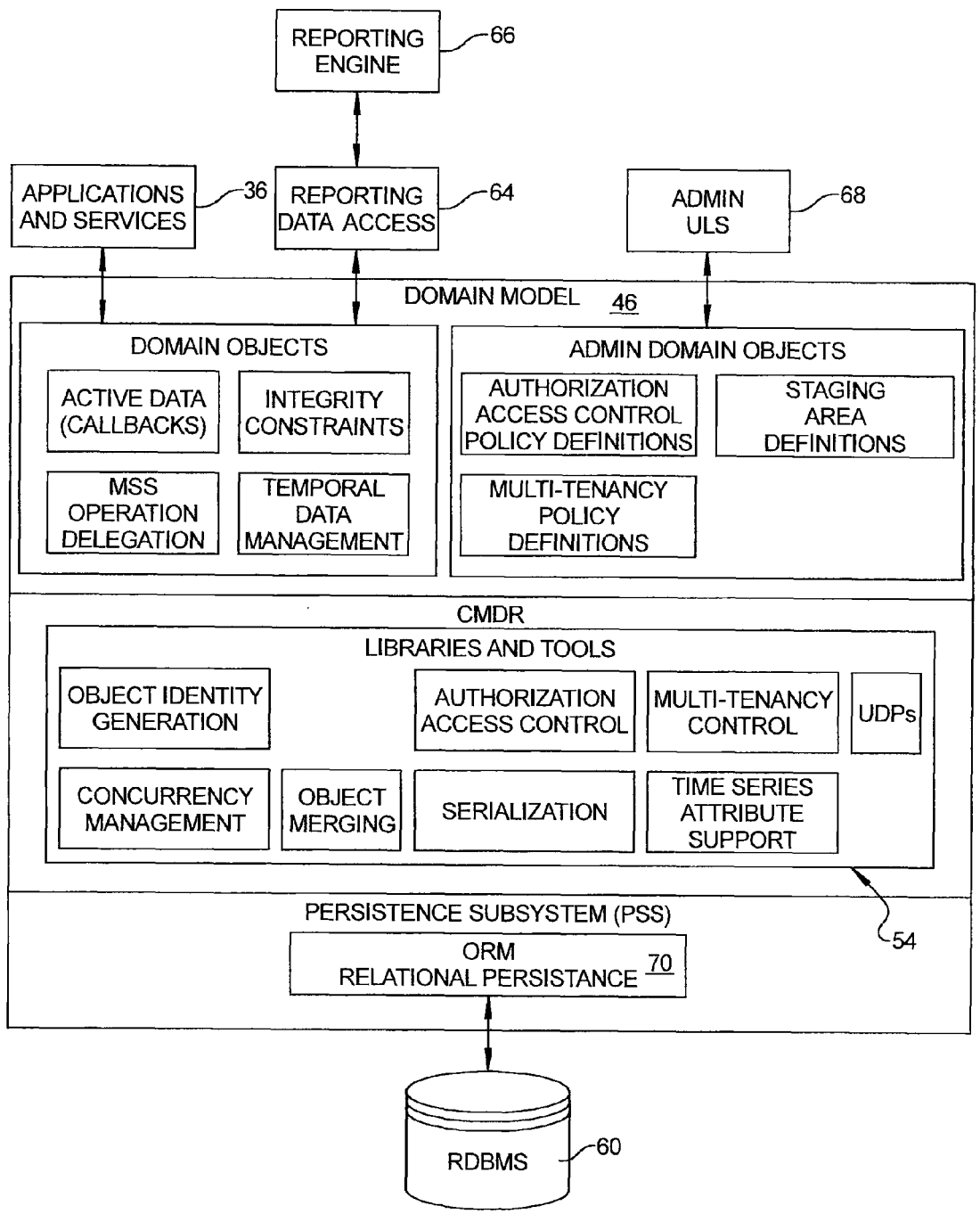
FIG. 7 is a high level block diagram showing the distinction between the domain objects that are used across domain models and DCIM domain objects.

Referring to FIG. 7, the CDMR 54 presents supervision control and data acquisition (SCADA) solution for the entities under management. This interface is tightly coupled to domain objects. The CDMR 54 supports an arbitrary set of domain classes (which constitutes the Domain Model). The CDMR 54 coordinates concurrent object modifications, supports domain object persistence and provides a number of other support services (like object identifier—OID generation conventions/mechanisms). In addition, the CDMR 54 offers a suite of facilities that can be called upon by domain class developers to address cross cutting concerns like authorization resolution/enforcement, multi-tenancy checks, volatile attribute access, etc.

Figure 8:
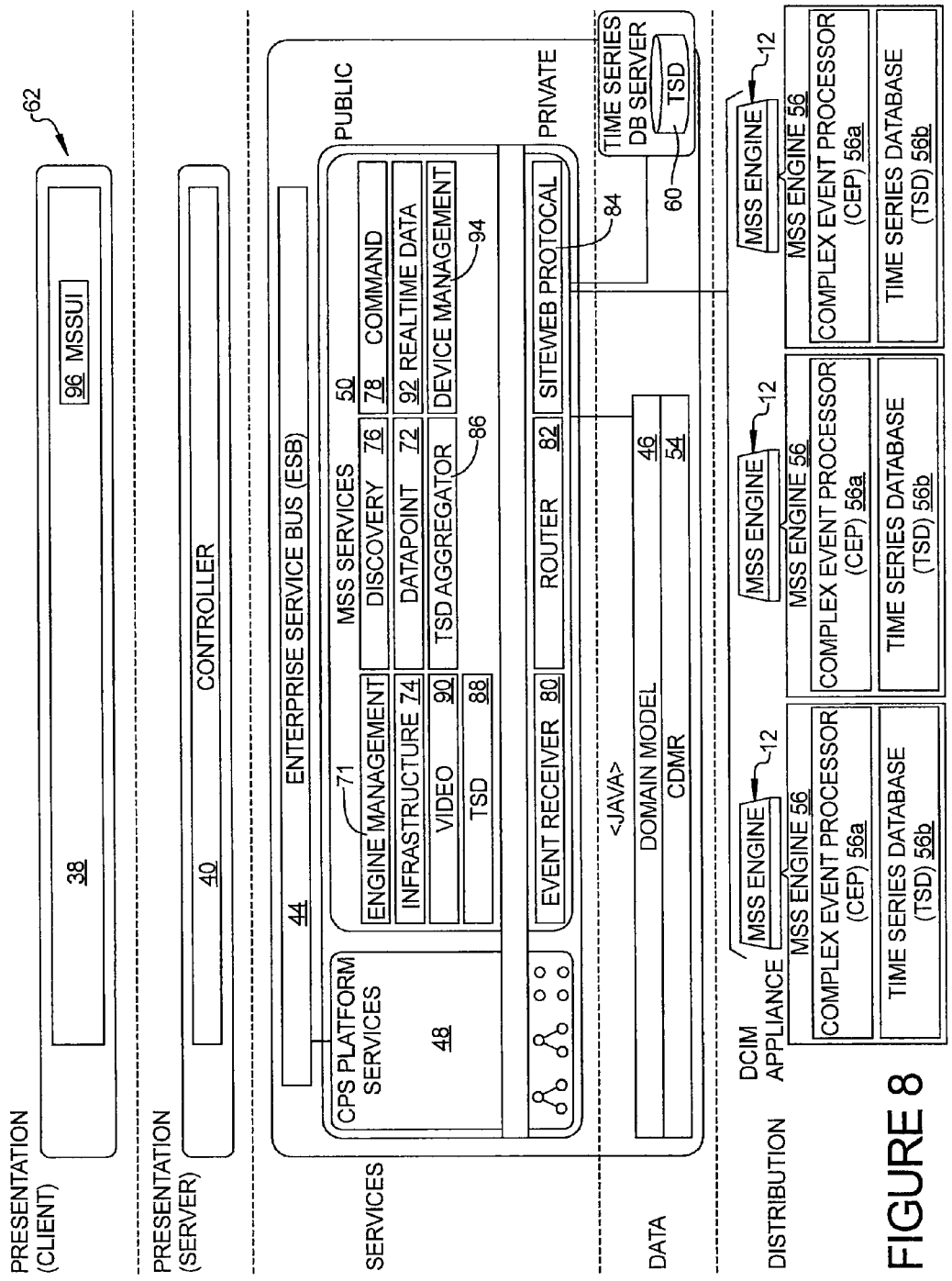
FIG. 8 is a high level block diagram of an architecture showing an interaction of MSS components with the Domain Model and the MSS Engine/DCIM Appliance.

For most purposes the DCIM Domain Model 46 hides a Manageability Subsystem (MSS) 62 that is formed by the MSS Services 50 and the MSS engines 56 (to be discussed further in connection with FIG. 8). Command and control operations are initiated through the Domain Model 46 and are delegated to the MSS subsystem 62 as needed.

Under the covers of the DCIM Domain Model 46, the MSS Engines 56 may reuse the CDMR-supported DCIM Domain Model 46. This obviates the need to design a distinct representation of domain model information—and the need to then map that into (and out of) the CDMR 54 supported DCIM Domain Model 46. This also allows the MSS Engines 56 to reuse the CDMR 54 for final (closest to the device and most recent) checking of authorization policies, multi-tenancy policies, integrity constraints and so on. To support multiple network operation centers, each and every CDMR 54 instance may participate in an eager (ASAP) eventual consistency regime.

The above discussion explains a distinction between the domain objects that are used across domain models and DCIM domain objects. Above, the domain objects that apply across domain models are called 'admin domain objects'. Essentially, these are the domain objects that describe some aspect of other domain objects—e.g. authorization policies (about domain objects), multi-tenancy policies (about domain objects), user defined properties (UDPs—associated with domain objects), etc.

In a literal sense, the depicted 'admin domain objects' are the domain model objects contributed by the 'platform' itself. More specifically, the examples shows are contributed by (and potentially required by) the CDMR 54 component of the platform.

The depicted libraries and tools may comprise the CDMR 54. The first of these may be a reusable (JAVA) library for generating global unique identifiers (GUIDS) to serve as object identifiers. Other libraries may help with resolving/enforcing access controls (e.g. authorization), multi-tenancy controls, user defined property management, serialization (e.g. generic, reflection driven, formatting), etc. In this sense, the dividing line between the Domain Model's 46 class implementations, and the CDMR 54, is somewhat blurred. It may be thought of as something of a dashed line. However, all application/service logic should be strongly insulated from whatever happens under the covers of the domain class interfaces. This effectively raises the level of abstraction at which application/service logic is implemented.

Interaction Requirements

The Domain Model 46, and it's supporting CDMR 54, provides storage agnostic data sharing across the DCIM product line. In addition, the Domain-Model/CDMR duo addresses cross cutting concerns related to data access, delegation of appropriate tasks to the Manageability subsystem (MSS) 62, data change triggers/callbacks, etc. Domain Model 46 consumers are application services, common platform services and even the Manageability Subsystem 62. The MSS Services 50 relays discovery information as new instances of Domain Model 46 classes (stored in the CDMR 54). The Domain Model 46 may represent a single source of truth—and a single source of history.

Applications and Services 36—CRUD Domain Objects as required to support application features.

Reporting Data Access 64—Read only access to the Domain Objects for reporting purposes. This requires a "data provider" for a chosen reporting engine 66.

Admin UIs 68—CRUD Admin Domain Objects defining access policies, multi-tenancy policies, integrity constraint policies and other policies. These policies configure and drive the handling of crosscutting concerns.

Manageability Subsystem 62 delegation—Certain operations (e.g. commands, controls, etc.) associated with domain objects should be delegated to the Manageability Subsystem 62 for ultimate execution. Current, volatile data access (for sensor readings, etc.) should also be delegated to the Manageability Subsystem 62 for real-time fetching (versus latest value/estimate lookup).

ORM/RDBMS 60 access—Domain objects are persisted to the RDBMS 60 via an Object Relational Mapping technology (layer 70). Direct access to the underlying RDBMS is a circumvention of the Domain Model 46 (and supporting CDMR 54) layers. For application/service level logic, direct access to the underlying RDBMS 60 would be a serious architectural violation.

On the other hand, the Domain Model 46 and the CDMR 54 are deliberately extensible, should specific bits of domain class related logic be best implemented via hand-crafted SQL, stored procedures, etc. When faced with some of the relatively rare, but most challenging, implementation needs, it may be necessary to sprinkle the implementation logic at the application level, the domain model level and even the CDMR/ORM/RDBMS levels.

Reuse

The DCIM product line's common data model leverages domain knowledge manifest in the representational models used in Aperture® Vista, the Avocent® MergePoint™ Infrastructure Explorer (AMIE), the information technology operations management (ITOM) library prototype, DSView, etc. The common data model may also leverage certain aspects of industry standards like the Distributed Management Task Force's (DMTF's) Common Information Model (CIM).

The CDMR 54 may be based on an industry-standard (SQL99) relational database management system (RDBMS).

Some of the most important domain classes, within the Domain Model 46, delegate manageability operations to the Manageability Subsystem 62. In addition, the Manageability Subsystem 62 feeds discovery/presence information, about domain class instances, into the Domain Model 46. Certain policies, for things like correlated event filtering, are also delegated to the Manageability Subsystem 62 for distributed processing (close to the sources of such events).

Manageability Subsystem

The Manageability Subsystem, represented by reference number 62, is shown in greater detail in FIG. 8. The Manageability Subsystem 62 provides the ability to discover and control Emerson and non-Emerson devices, and collect and analyze real time data from those devices. The Manageability Subsystem 62 may be made up of three major areas:

MSS Services 50—exposes public services on the platform 42 to provide applications and the Domain Model 46 with access to Manageability Subsystem 62 features such as the retrieval of historical data points that have been collected over time and the retrieval of data points on demand directly from the end devices. The Manageability Subsystem 62 provides private services used for communication between the platform 42 and the MSS Engines 56.

TSD 52 (Time Series Database)—stores the historical data points that have been collected over time. Applications and the Domain Model 46 can retrieve these data points through the public interfaces exposed on the platform 42.

Manageability Subsystem 62

MSS Engine 56—may be software that runs in the DCIM appliance 12 providing discovery and control of Emerson® and non-Emerson devices, and collection and analysis of the real time data from those devices. The MSS Engine 56 may contain the knowledge for how to communicate with Emerson® and non-Emerson devices. The MSS Engine 56 communicates with the MSS Services 50 running on the platform 42. Multiple MSS Engines 56 can be deployed in the customer environment to provide scalability as the number of managed devices to be supported grows. Each MSS Engine 56 may use a Complex Event Processor (CEP) 56a to ensure real time data aggregation and correlation. A Time Series Database 56b may be associated with each MSS Engine 56 for storing collected real time data. The following section briefly describes Manageability Subsystem 62 components with the Domain Model 46 and the MSS Engine 56/DCIM appliance 12.

Engine Management—An Engine Management service 71 provides the ability to manage Domain Model objects that represent the MSS Engines 56 and related objects, such as product knowledge and plug-ins. This service also provides the ability to add, update and manage MSS Engines 56 that are of the DCIM Solution 10.

Datapoint—A Datapoint service 72 provides the ability to access collected metric data and to configure the rules related to data point collection, aggregation, and analysis.

Infrastructure—An Infrastructure service 74 provides the ability to manage the infrastructure (devices, containers, relationships, collection rules, aggregation rules, and analysis rules) of the MSS Engine 56. The infrastructure service 74 keeps the infrastructure objects synchronized between the Domain Model 46 (and supporting CDMR 54) and the MSS Engines 56. As changes and additions are made to Domain Model objects on the platform 42 the necessary information is synchronized with the MSS Engines 56. The infrastructure service 74 service also handles synchronizing new and updated devices/relationships that are discovered by the MSS Engines 56 with the Domain Model 46 of the platform 42.

Discovery—A Discovery service 76 provides the ability to manage the discovery parameters and also provides means to perform on-demand discovery. The MSS Engines 56 actually perform the on-demand discovery and background discovery activities based on these configured discovery parameters.

Command—A Command service 78 provides the ability to execute commands on devices, such as PowerOff and PowerOn. The MSS Engines 56 actually handle sending the necessary commands to devices or appliances to cause the desired action on a device.

Event Receiver—An Event Receiver 80 service processes unsolicited events received from one or more MSS Engines 56. These events are converted as needed to match the Domain Model 46 definitions of the platform 42 and these events are then forwarded to the Events system of the platform 42.

Router—A Router component 82 handles the routing of requests between the MSS Services 50 and the MSS Engines 56. For requests from the MSS Services 50 this component determines the appropriate MSS Engine 56 to handle the request, such as an on-demand discovery request or a Power Off request. For request from the MSS Engines 56 this component determines the appropriate MSS Service to handle the request.

SiteWeb Protocol—A SiteWeb Protocol component 84 implements proprietary SiteWeb protocol and provides communication between MSS components and MSS Engine 56/DCIM appliance 12.

TSD Aggregator—A TSD Aggregator services 86 communicates with the TSD 60 to perform aggregation of infrastructure container(s) that span devices managed by more than one MSS Engine 56. The aggregation rules define how the data is aggregated and the results are stored in the TSD 60.

Video—A Video service 90 provides the ability to retrieve video content stored or captured in the MSS engines 56. Video data can be streamed from the MSS Engines 56 to consumers.

Realtime Data—A Realtime Data service 92 provides the ability to retrieve metric values in realtime in a streaming/ongoing manner from the MSS Engines 56. The real-time data can be streamed from the MSS Engines 56 to consumers.

TSD—A TSD service 88 provides the ability to manage Domain Model objects that represent the TSD 60 and the ability to configure the TSD 60.

Device Management—A Device Management service 94 provides the ability to perform upgrades, configure and manage devices.

Interaction Requirements

The MSS Services 50 manipulate domain objects via Java interfaces exposed by the Domain Model 46 for data persistence and access. This enables the following:

Provides basic create, update, delete, and querying of domain objects;

Allows for synchronization of new or updated domain objects identified by discovery of the MSS Engine 56;

Allows for synchronization of domain objects between the Platform 42 and the MSS Engines 56; and Allows access to rules to control data aggregation and data analysis.

Delegate methods of the domain objects in the Domain Model 46 may consume public MSS Services 50 using SOAP via the Enterprise Service Bus (ESB) 44. These delegate methods may be used to perform the following activities:

Execution of commands, such as PowerOff;

Retrieve historical metric values;

Retrieve on-demand metric values; and

Perform on-demand discovery operations.

The public and private MSS Services 50 may use the Router component 82 to route requests to the appropriate MSS Engine 56.

The MSS Services 50 may consume CPS Platform Services of the platform 42 using SOAP via the ESB 44. The CPS Platform Services may be consumed for the following reasons.

Consume Authorization Service to determine that necessary rights for enforcement of functionality provided by the MSS Services 50;

Consume Licensing Services to determine what functionality is available by the MSS Services;

Consuming Eventing Service for the publishing of events; and

Consuming Eventing Services for the registration of notifications based on events.

The MSS Services 50 may use a suitable communications component to communicate with the MSS Engine 56.

The MSS Services 50 interacts with the MSS Engines 56 on the DCIM appliance 12 using a suitable communication component to achieve the following functionality.

Command Execution;

Discovery;

Data Collection;

Firmware Upgrades; and

Configuration.

An MSS UI 96 interacts with the Presentation server 40 (i.e., its controller) over HTTP and the controller interacts with the MSS Services 50 using SOAP or another suitable protocol (e.g., via the ESB 44).

The Application Services 36 (FIG. 5) may consume video and real time data streaming via a publication/subscription mechanism from the MSS Services 50. The video and real-time data streaming may be retrieved from the MSS Engines 56.

DCIM Appliance

Figure 9:
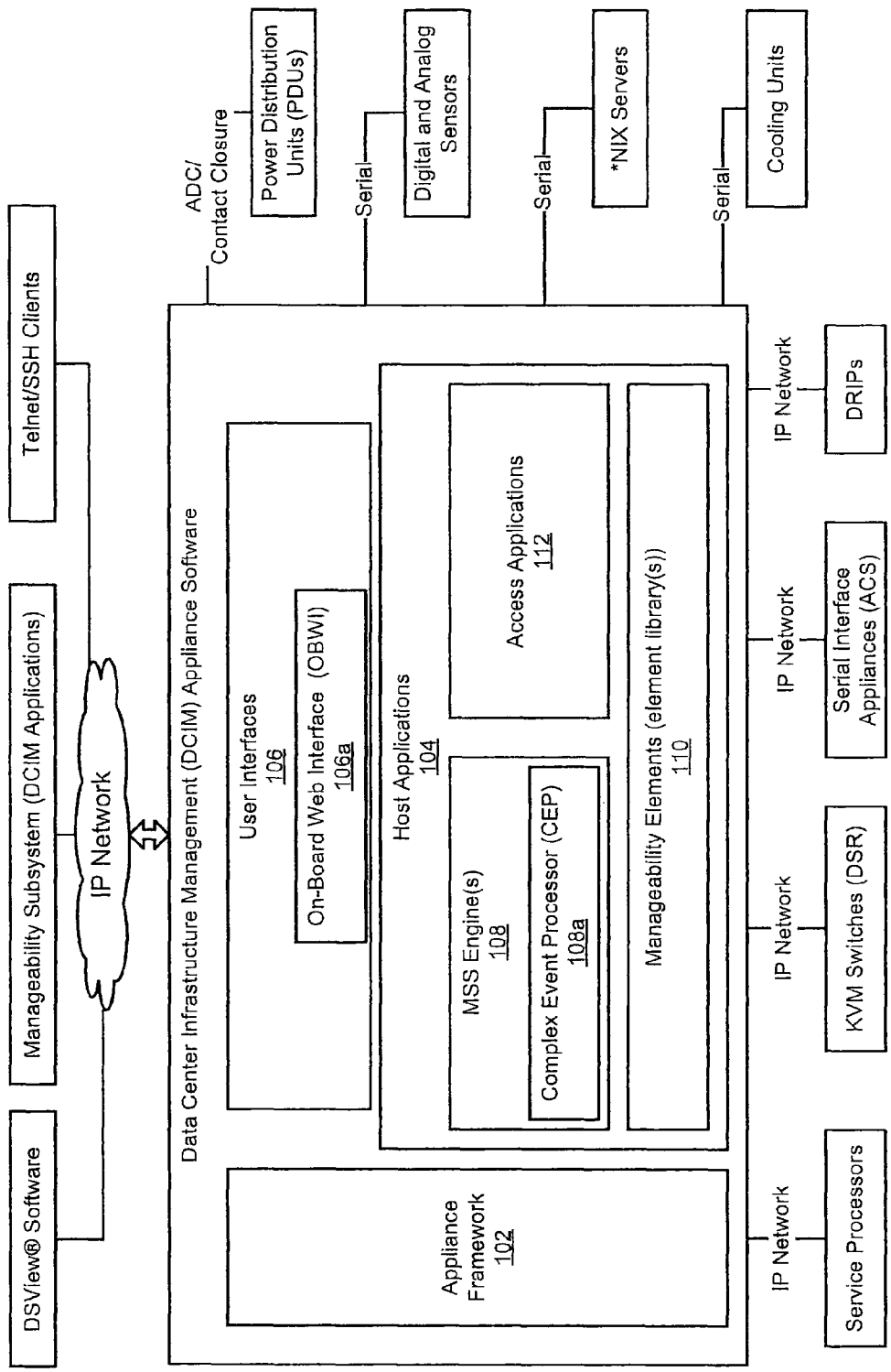
FIG. 9 is high level block diagram showing one exemplary software architecture of the DCIM Appliance.

The DCIM Appliance 12 is shown in a more detailed embodiment in FIG. 9, which embodiment is denoted by reference number 100. For convenience the DCIM Appliance will be referred to throughout the following discussion simply as the "appliance 100." It is a principal advantage of the appliance 100 that it integrates a plurality of functionalities into one component that have heretofore often been implemented in different components: 1) keyboard/video/mouse (KVM); 2) serial device communications; 3) service processor (SP) communications with a SP of a server; 4) performance metric data collection of managed devices via the MSS engine; and 5) rack data unit (RDU) functionality for communicating with remotely located sensors. Importantly, the location of the MSS engine within the appliance 100, which places it much closer to the various sources that it is collecting data from, enables the data to be collected at a central location (i.e., at the appliance 100) without having to transmit the data over the main (i.e., production) network, and therefore frees up significant bandwidth on the main network. Thus, only aggregated or filtered data, which may include alarms or possibly SNMP traps, will be transmitted from the appliance 100 over the network and to the appropriate user applications. This feature will be explained in greater detail in the following paragraphs.

The appliance 100 therefore provides the gateway between the DCIM application layers and the actual infrastructure devices which are being managed. It may also provide a collection of industry standard interfaces such as an On-board Web Interface (OBWI), an SSH/Telnet based CLI 104, and SMASH Command Line Protocol (SMASH/CLP) which allow it to provide device management in a standalone environment. The external interfaces are purposely limited to provide a subset of the overall functionality available to the DCIM application suite. There are also Avocent specific protocols used for access purposes which are currently consumed by Avocent DSView® management software 106 and may eventually be used for DCIM based access applications.

The appliance 100 is thus a physical component that may be viewed as serving at least two distinct functions: 1) a consolidated access appliance combining KVM, Service Processor Management (SPM) and Serial and Rack Data Unit (RDU) remote access functions; and 2) in conjunction with the MSS engine, acting as a common collector for data from managed devices. It is important to note that the appliance 100 is an integral part of the DCIM solution. Thus, the appliance 100 incorporates hardware, firmware and software that have all been developed to maximize the overall capabilities of the DCIM solution.

Software Architecture of Appliance

With further reference to FIG. 9, the software architecture of the appliance 100 may be thought of (at a high level) as being divided into three major areas including 1) appliance framework 102; 2) host applications 104 and 3) user interfaces 106 that may include an On-board Web Interface 106a. The host applications 104 may include an MSS engine 108 and a collection (i.e., library) of manageability extensions (or "elements") 110, along with access applications 112. The MSS engine 108 may include a complex event processor 108a for analyzing information and data collected by the MSS engine.

The appliance framework 102 provides a set of common services such as database management, authentication, and others which can be used by all of the components in the system. Another important part of the appliance framework 102 is a set of standardized communication interfaces that components can use to move data and messages to and from the appliance 100.

The manageability elements 110 may also be viewed as an "element library", and may consist of components (i.e., protocols, commands, definitions, etc.) that know how to speak to the individual external managed devices that are interfaced to the appliance 100. Some examples of managed devices include:

KVM Switches
Serial Interface appliances
Power Distribution Units (PDUs)
Digital RIPs (i.e., "DRIPs")
Service Processors ("SPs")
Cooling units
Unix and Linux servers (*NIX Servers)
Digital and Analog Sensors
Third party devices The host applications 104 also may include the application components which perform various tasks but do not have any external interfaces. The MSS Engine 108 components, such as the Complex Event Processor (CEP) 108a and a Time Series Database (TSD; not shown) in which data is stored, as well as some extended features inherited from the access portions of the host applications, are all examples of applications.

The user interfaces 106 contain the user interfaces such as the On-board web user interface (OBWI) 106a, command line interfaces, and of particular importance, the MSS Manageability Protocol. The communication interfaces provided by the framework 102 allow a common method for the UI components to get data and send control messages to the various applications and also to the manageability element library 110. A base host software platform (not specifically shown in FIG. 9), in one implementation, may be based on the Linux vServer patch and functions as an OS virtualized platform. This allows Linux based applications to run with minimal changes on top of the base host software platform.

A significant feature of the appliance 100 software architecture is that, to the user, it provides the appearance and "feel" of a single cohesive appliance even though the appliance 100 may be acting as a gateway to several underlying disparate software applications. To achieve this, the host system may be setup to provide several system functions that provide a gateway between the external user and the internal guest applications. These include licensing, AAA and user interfaces. These functions take the external input and map it on to the correct guest application without the user requiring any knowledge of the underlying architecture. For example when a user authenticates to the appliance 100, the AAA function informs each of the guest applications that the user is valid. Accordingly, the user does not need to authenticate to each specific guest application separately. Additional host items may include items such as a Linux kernel, a base file system and hardware component driver support.

Another important feature of the architecture of the appliance 100 is that it allows the appliance 100 to be easily deployed in a variety of configurations with support for different numbers and types of managed devices being supported in each configuration. This design, which is based on pluggable components, is also intended to allow easily adding new classes of managed devices as a product line progresses. Each appliance 100 that is deployed may reside in a given rack within a datacenter, or within a rack at a Telco central office, or within any other facility control center or area suitable for locating the appliance 100. The arrangement of interfaces on the appliance 100 allows for connectivity to various types of equipment and provides the user with access to a wide variety of types of external equipment for control and performance metric collection. Thus, a combination of hardware and application software defines the appliance 100.

Appliance Hardware Configuration

Figure 10:
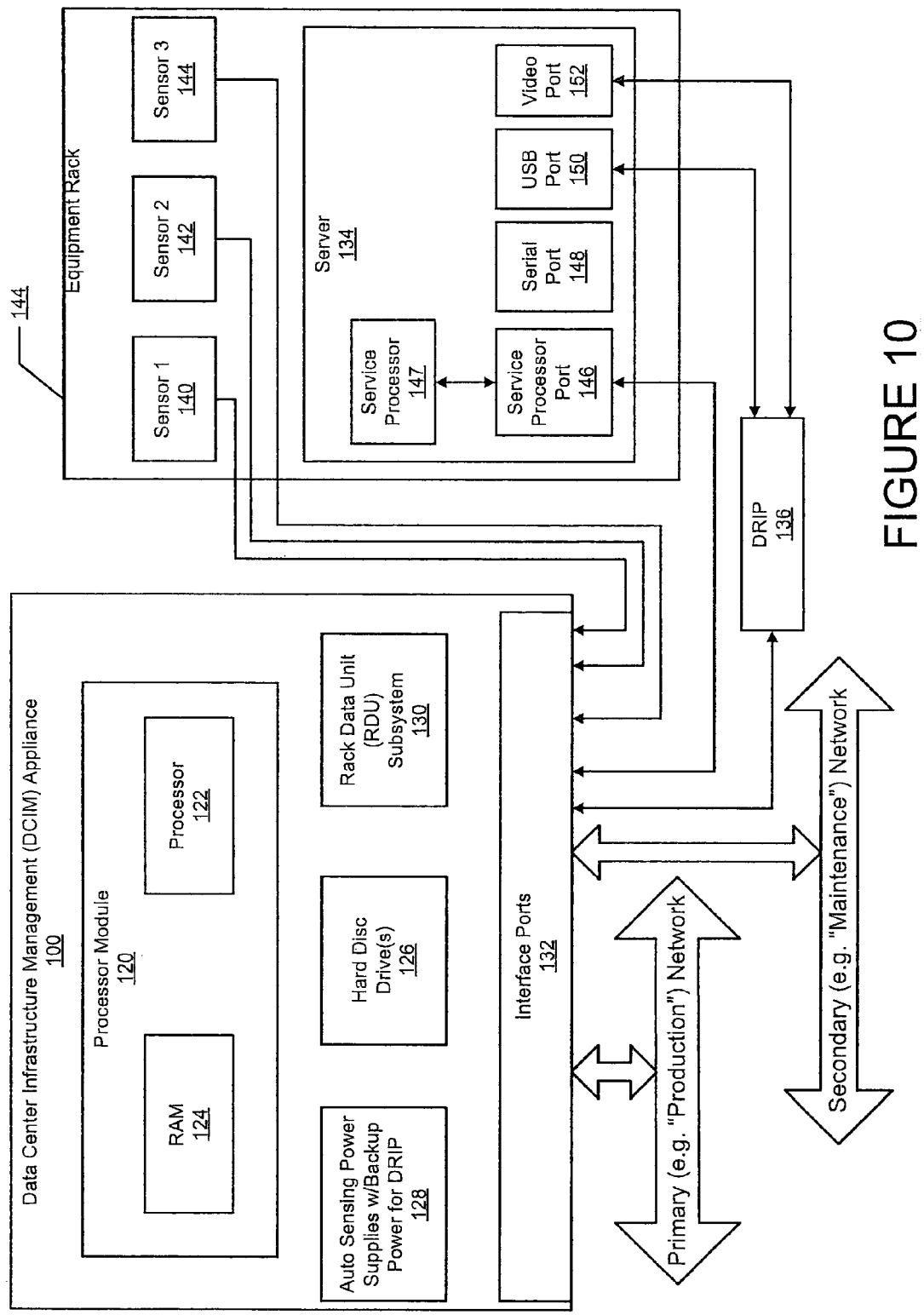
FIG. 10 is a high level block diagram of one embodiment of a hardware configuration for the DCIM appliance.

Referring now to FIG. 10, there is shown a high level block diagram of one embodiment of various hardware components that may be used to form the appliance 100. However, it will be appreciated that the specific hardware configuration of the appliance 100 may be modified easily and extensively beyond the configurations described herein through the selection of different processor modules and memory components, and/or various other components.

As shown in FIG. 10, the appliance 100 may include a processor module 120, which in one implementation may be Computer On Module (COM) Express module. The processor module 120 may have a processor 122 and a random access memory (RAM) 124 located thereon. The processor module 120 may be in communication with one or more hard disc drives 126. At least one, but more preferably a pair of, autosensing power supplies 128 may be included in the appliance 100 for powering the appliance. The autosensing power supplies 128 may also function to provide backup power to digital rack interface modules (DRIPs) that are interfaced to the appliance 100. A rack data unit (RDU) subsystem 130 provides RDU monitoring functionality to enable a wide variety of external sensors to communicate directly with the appliance 100 and provide valuable environmental monitoring information to the appliance.

The appliance 100 also includes a plurality of Interface ports 132 which include both front panel and rear panel mounted interface ports, which will be described in greater detail momentarily. The interface ports 132 allow interfacing the appliance 100 to various external networks, managed devices and/or sensors. The table in FIG. 13 shows a plurality of specific types of interfaces that may be included to form the collection of interface ports 132.

FIG. 10 also shows an example of one managed device, that being a server 134, that the appliance 100 is interfaced to via a DRIP 136. It will be appreciated immediately that in a real world application one appliance 100 may be interfaced to a much larger plurality of managed devices, and in large scale applications is expected to be interfaced to dozens of different managed devices including servers, PDUs, serial devices, sensors, etc. Also, while a DRIP 136 is shown as facilitating the interface, it will be appreciated that the DRIP is used to enable KVM functionality with a target server, but would not be needed for interfacing to various other managed serial or Ethernet devices, or for interfacing to various sensors. In FIG. 10 the server 134 is mounted within an equipment rack 138 having sensors 140, 142 and 144. The server 134 may include, for example, a service processor port 146 (i.e., an RJ-45 jack that forms an Ethernet port) in communication with a service processor 147, a serial port 148 (e.g., an RS-232 port), a USB port 150 and a video port 152. The appliance 100 may also be connected to one or both of a primary network and a secondary network.

Front and Rear Panels of Appliance

Figure 11:
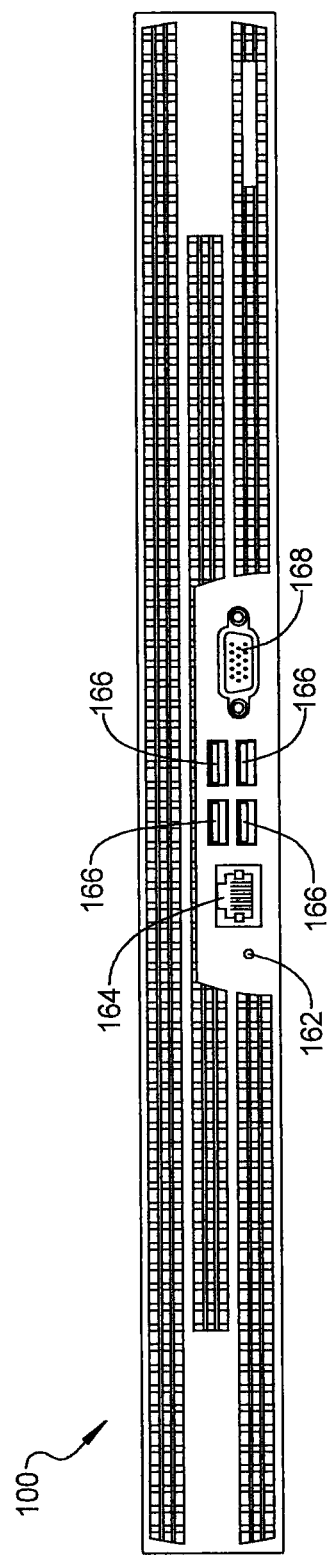
FIG. 11 is a view of a front panel of the DCIM appliance.
Figure 12:
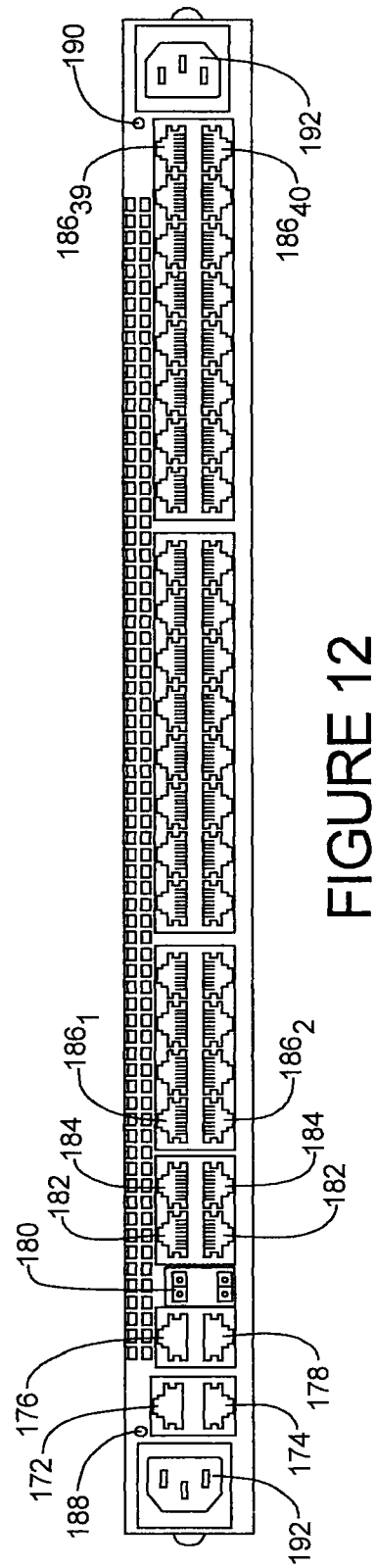
FIG. 12 is a view of a rear panel of the DCIM appliance.

Referring to FIGS. 11 and 12 there are shown views of a front panel 160 and a rear panel 170, respectively, of the appliance 100. In FIG. 11 the front panel 160 may include a power indication LED 162, a serial console port 164 (formed by an RJ-45 jack), a plurality of USB ports 166 and an analog video port 168. In FIG. 12 the rear panel 170 includes a plurality of interfaces for connecting to various Ethernet and serial devices including: 1) a digital rack interface pod (DRIP) for enabling a KVM session; 2) IP based service processors—as supported by the Service Processor Manager (SPM); 3) IP based devices (as supported by the MSS); and 4) serial based managed devices (such as may supported by the Avocent ACS 6000 serial console server). More specifically, the rear panel 170 may include a network primary port 172 and a network secondary port 174. The network primary port 172 may be formed by a dual RJ-45 jack combined with the network secondary, and the network secondary port 174 may be formed by the RJ-45 when combined with the network primary. An RS-485 port 176 is formed by one half of a dual RJ-45 jack and provides an interface to communicate with RS-485 protocol devices. A RDU I/O (E-link) port 178 is formed by a single RJ-45 jack and enables communication with an external sensor (such as one of sensors 140-144 in FIG. 10) via an E-link interface. An RDU digital relay screw terminal block 180 enables the switching of a signal being applied to one or more external devices (e.g., a beacon or alarm). A pair of RDU input sensor ports 182 is formed by one half of a 2×2 ganged RJ-45 jack, and a pair of RDU 1-wire sensor ports 184 is formed by the other half of the 2×2 ganged RJ-45 jack. Thus, a wide variety of sensors may be directly interfaced to the appliance 100, and RDU functionality provided by the appliance 100, without the need for an independent RDU device. A significant advantage of this is that sensor signals that might otherwise need to be communicated over the production network can be collected directly at a central location (i.e., at the appliance 100) without using any bandwidth from the production network.

A plurality of autosensing ports $186_1$-$186_{40}$ of the appliance 100 may be formed by a pair of 2×8 ganged RJ-45 jack assemblies and one 2×4 ganged RJ-45 jack assembly. By "autosensing" it will be understood that each of the ports $186_1$-$186_{40}$ is able to detect whether an Ethernet device or a serial device has been connected thereto, and to internally handle routing of the signals accordingly. The appliance 100 also has the ability to detect which one of two different RJ-45 plug pinout configurations (either an ACS pinout configuration or a predetermined alternative pinout configuration) is being used when a serial device has been coupled to one of the autosensing ports $186_1$-$186_{40}$. In one specific implementation the alternative pinout configuration may be a configuration used by Cisco Systems, Inc. devices. An LED 188 mounted at the upper left area of the appliance 100 housing may indicate that a first one of two power supplies of the appliance (forming autosensing power supplies 128 in FIG. 10) is operating within specified limits. An LED 190 mounted at the upper right corner of the appliance 100 housing may indicate that a second one of the two power supplies is operating within specified limits. A pair of AC power jacks 192 may also be included to enable power from an external power source to be applied to each of the autosensing power supplies 128 (FIG. 10). The autosensing power supplies 128 may be supplied with 120 VAC or 240 VAC power.

The primary and secondary network ports 172 and 174, in one implementation, may operate at bit rates up to 16 Gps in accordance with IEEE 802.3ab specification, and may also support auto switching of the data rate and duplex. Additional colored LEDs (not shown) may be integrated into the primary and secondary network port RJ-45 jacks to denote speed and duplex. Each of the autosensing ports $186_1$-$186_{40}$ may include different colored LEDs, such as green and amber LEDs, to indicate Ethernet activity (e.g., blinking green), that an Ethernet link has been established (e.g., solid green), or that a KVM, serial or service processor (SP) session is active. The autosensing ports $186_1$-$186_{40}$ may also be manually configured as IP or serial via a user interface to the appliance 100, and the pinout (e.g., ACS or Cisco) may also be manually configured by the user via the user interface. Manually configuring a port may disable autosensing for that port. When configured as IP ports, the autosensing ports $186_1$-$186_{40}$ in one implementation may operate up to 100 Mpbs in accordance with the IEEE802.3 specification, and at bit rates up to 230400 bps in accordance with the RS-232C specification when configured as serial ports. When configured as IP ports, the autosensing ports $186_1$-$186_{40}$ may support automatic switching of the data rate and duplex, as well as automatic pinout detection when they are configured as serial ports.

Each of the RDU 1-wire ports 184 provides connectivity for 12C and 1-wire sensors used to sense air temperature and temperature/humidity, for example inlet air temperature (i.e., ambient) to a rack and exhaust air temperature from a rack, just to name a few possible sensor applications. Each of the RDU DI (digital in) ports 182 may provide connectivity for up to four sensors with the use of an external splitter, and will support at least the following types of sensors: door, motion, leak, vibration and smoke. The RDU digital relay 180 may be programmed, for example, to close or open upon the appliance 100 receiving an alarm. When power is removed from the digital relay its relay contacts may open (or alternatively the contacts may be configured to close upon removal of power). The RDU I/O E-link port 178 may be used for connection to an external RDU I/O module and other sensors, and for example may support a water sensor. The RS-485 interface port 176 may be used to connect to serial RS-485 sensors.

Network Modes

The appliance 100 further enables the network primary and secondary ports 172 and 174 to be configured to implement one of a plurality of different network modes: a "normal" mode, a "failover" mode and a "bridged" mode. When the "normal" mode is active, the network primary port 172 and the network secondary port 174 operate independently with their own IP and MAC address. When the "failover" mode is active, both of the network ports 172 and 174 are bonded together presenting a single IP and MAC address to the outside world. The appliance 100 can thus receive or send data on either port 172 or 174. If the network primary port 172 fails, the network secondary port 174 continues the operation. If the network primary port 172 subsequently recovers, it automatically resumes sharing the networking operation. When the "bridged" mode is active the appliance 100 acts as a switch between the primary and secondary and any private subnets configured on the target network ports. The appliance 100 routes traffic between the local Ethernet ports and the target ports. The appliance 100 retains its own IP address and presents a single IP and MAC address to the outside world. The "bridged" mode exposes target devices to a wider network and the network administrator is responsible for network security of targets connected to the appliance 100.

Security

The appliance 100, in one specific implementation, meets the requirements of the FIPS140-2 Level 2 security certification. The appliance 100 supports the use of Kerberos TGT for SSH and Telnet connections, as well as SSH X.509 or private/public key pairs for SSH connections. The appliance may generate a self-signed certificate when it first boots. This certificate may be used to verify OBWI/Local user interface (UI) sessions.

DSView® Remote Access Software Support

In one implementation the appliance 100 may support remote access applications using the Avocent DSView® remote access software. This is accomplished by a plug-in loaded into DSView®. This enables users who are already using DSView® remote access software to access, control and manage Avocent KVM, serial and service processor management appliances. This enables users to continue using their DSView® remote access software as their primary console for access and control, while still allowing the appliance 100 to be integrated as a communications gateway between the user's managed KVM/serial/SP appliances and new software applications running on the appliance 100. In this configuration the appliance 100 is also able to collect monitoring data from the managed appliances, via the MSS engine(s) 108, and to send it to the Manageability Subsystem, without interfering with the user's access and control of the managed devices via the DSView® remote access software.

KVM Functionality

A significant advantage of the appliance 100 is the ability to integrate KVM functionality with the various other functionalities discussed above (i.e., serial, RDU, SP and MSS engine data collection). The KVM functionality of the appliance 100 is able to support up to 64 KVM sessions or vKVM (i.e., virtual KVM) sessions simultaneously, with up to 8 KVM (shared) sessions per DRIP 136. Viewing a KVM session may be accomplished by the use of a suitable viewer application that may be loaded on a client laptop, client PC or other client device. At present two different viewer applications are supported: a Java based viewer and an active X viewer. A warning may be supplied to the user if the appliance 100 currently has a VM session to the same target server, allowing the user to disconnect the SP VM session. A number of specific KVM features are provided by the appliance 100:

Start KVM Scan

The Scan feature allows the KVM displays of multiple targets to be shown in sequence for a short period of time. The user is able to scan the KVM of a Target Group. The user is also able to scan the KVM of a user selection of Targets. Scans may be performed full screen sequentially. While a target is being scanned the user may interrupt the scan and continue viewing the current target's KVM session by right clicking in a video viewer application and selecting a menu item. A KVM scan running on the local port may be cancelled by pressing any key or moving the mouse.

Configure KVM Scan

The user may configure the time taken to display each KVM Session while the KVM scan is in progress. The time taken to scan each device in the KVM scan shall be configurable by the user. The setting may be global for all KVM sessions. The default value may be a predetermined value, for example 30 seconds. For scans that are ongoing when the time period is changed, the new time may be applied when the next device in the scan sequence is scanned.

Join Existing KVM Session

One or more users can join an existing KVM session. A user shall be able to join an existing KVM session and view the video of the session.

Create KVM Bookmark

The User is able to create a bookmark to a KVM session allowing the recreation of that KVM session easily though a shortcut on the client desktop/web browser. The bookmark data/URL preferably may not contain any password information. The following data may be included in the bookmark data: target device and KVM settings (e.g., single cursor mode and access settings).

View KVM Bookmark

This feature allows a user to open a previously saved Bookmark on the client PC and automatically start a KVM session based on the settings stored in the Bookmark. When activated, the user shall be prompted for his password. Once entered, the appliance 100 creates a KVM session with the assigned Target and drive mappings.

Align Mouse

This feature allows the user to synchronize the client mouse pointer with the mouse pointer in the KVM session. The user is able to align the local mouse cursor with the KVM mouse cursor via a control option on the video viewer.

Single Cursor Mode

This feature allows the user to hide the KVM mouse pointer and only see a single mouse pointer on the client PC or KVM session. The user is able to enter/exit Single Cursor Mode where the local mouse and the KVM mouse are combined. This feature may only be supported on Targets running a Microsoft WINDOWS® operating system.

KVM Direct Access

The user is able to configure a KVM port to be accessible by a user-defined public-facing IP address. When the user launches a browser to the configured IP address, the KVM viewer application to the defined port is displayed after user authentication. This feature is similar to the SP Native IP and Serial Target IP alias features, but for KVM access.

DRIP Discovery

DRIP modules connected to the appliance 100 may be discovered using DHCP. Each DRIP 136 may be associated with a single appliance IP port via its MAC Address.

Identify DRIP

This feature allows an operator to signal an LED on the DRIP 136 to flash so that the cable/server it is connected to can be easily located. The user is able to individually set an indication LED on each connected DRIP to flash at a 50% duty/2 Hz cycle until commanded otherwise.

Authorization and Authentication

The KVM <function> authenticates users for the DRIP.

CONCLUSION

The DCIM Solution 10 can thus be seen to form a comprehensive family of hardware and software products that provides more effective and efficient management of data center infrastructure. The DCIM Software Suite allows the datacenter manager to completely control and manage every aspect of his/her enterprise, whether locally or remotely, from a graphically rich, web-based user interface (UI). The DCIM appliance 100 helps to accomplish this through the use of a single piece of hardware (either per rack, per zone or per data center), where in the past multiple hardware devices/units have been required. Together, the DCIM appliance 100 and Software Suite allow the datacenter manager not only to manage his/her current configuration, but to project and plan ahead for future needs, and when those needs become reality, to implement/accommodate them seamlessly and cost-effectively.

The overall DCIM Solution 10 also enables significant scalability. For one, the DCIM Solution 10 enables an option to connect to a separate database server of a database server farm; and/or the ability to conform to load balancing systems for web access to a larger user community; and the ability to conform to reporting servers to serve a larger number of report requests. The DCIM Solution 10 also enables the ability to conform to security and access system requirements, and the ability to conform to directory services systems for authentication and authorization and role information for users.

The DCIM appliance 100, through its software and hardware, enables several distinct and disparate functionalities to be implemented from a single component, those being, without limitation: 1) KVM functionality to support KVM sessions with target managed devices; 2) serial communications with managed serial devices; 3) communications with service processors associated with the servers that the appliance 100 is interfaced to; 4) the collection of data via the MSS engine from a service processor (SP) of each server that the DCIM appliance 100 is interfaced to, at a central collection point (i.e., at the appliance 100), and without the need to consume bandwidth on the production network; and 5) RDU functionality for the collection and/or monitoring of various sensors deployed throughout the data center environment, and without the need to transmit the collected data over the production network.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as to is necessary in view of the pertinent prior art.

What is claimed is:

1. A system for enabling monitoring a plurality of managed devices by a user located remotely from the managed devices, the system comprising:
    a plurality of remote access appliances for facilitating communications between the managed devices and a user located remotely from the appliances and from the managed devices;
    each remote access appliance including:
        a housing;
        a processor disposed within the housing and adapted to facilitate communication of keyboard, video and mouse information between the appliance and the managed device;
        a manageability subsystem disposed within the housing for communicating with the managed device and collecting information from at least one of the managed devices concerning operation of the at least one managed device via a communications link with the remote access appliance, and where the communications link does not involve transmitting the collected information over a network; and
        a rack data unit (RDU) subsystem disposed within the housing;
        an interface subsystem including at least one RDU port in communication with the RDU subsystem, the at least one RDU port operable to connect the remote access appliance via a cable connection directly to the at least one managed device to directly receive a sensor output from the at least one managed device;
        the manageability subsystem including an element library that stores parameters associated with the managed device; and
    wherein the remote access appliances form a distributed manageability subsystem configuration that enables each said remote access appliance to contribute to collecting the information from the managed devices.

2. The system of claim 1, wherein the manageability subsystem includes a manageability services module adapted to facilitate communication between at least one of the managed devices and a user located remotely from the at least one managed device.

3. The system of claim 2, wherein the manageability subsystem further includes:
    a manageability engine module configured facilitate communication between the at least one managed device and the manageability service module.

4. The system of claim 3, wherein the manageability engine module further is configured to collect data from the at least one managed device.

5. The system of claim 1, wherein the manageability subsystem further includes an event service module that generates events based on the collected data.

6. The system of claim 5, wherein the event service module subsystem further includes a complex event processing subsystem to generate events based on the collected data.

7. The system of claim 1, wherein the parameters stored in the element library provide for discovery, the data collection and control of at least one of the managed devices.

8. The system of claim 1, wherein at least one of the appliances is adapted to receive information from a service processor port of the managed device.

9. The system of claim 1, wherein the RDU port of at least one of the appliances includes at least one of the following:
    a RDU digital interface port; and
    a RDU e-link port.

10. The system of claim 1, wherein the interface subsystem includes one of:
    a RDU one-wire port;
    a RDU digital relay;
    an RS-232C interface port; or
    an RS-485 interface port.

11. The system of claim 1, wherein the interface subsystem includes a network primary port and a network secondary port.

12. The system of claim 1, wherein at least one of the appliances includes a front panel, the front panel having a plurality of ports including a serial port, a universal serial bus (USB) port, and an analog video port.

13. A system including a plurality of remote access appliances for facilitating communications between a plurality of managed devices and a user located remotely from the appliances and from the managed devices, each one of the appliances of the system comprising:
    a housing;
    a processor housed within the housing and adapted to facilitate communication of keyboard, video and mouse information between the appliance and at least one of the managed devices;
    a rack data unit (RDU) subsystem housed within the housing and adapted to communicate with a plurality of remotely located sensors, wherein at least one of the remotely located sensors is operably associated with the at least one managed device, and to receive sensor data from the remotely located sensors, without the need to transmit the sensor data over a network;
    at least one RDU port in communication with the RDU subsystem, for enabling a direct connection via a cable with a sensor output of the at least one remotely located sensor;
    a manageability subsystem housed within the housing for communicating with the at least one managed device and receiving data via a connection between the appliance and the at least one managed device, where the connection does not involve the use of a network; and
    wherein the appliance is configured to receive information directly from a service processor port of the at least one managed device, and to send information to the service processor port of the at least one managed device;
    wherein each one of the appliances includes a sensor port for connecting directly with sensor outputs of the managed devices; and
    wherein the appliances of the system collectively form a distributed manageability subsystem configuration that enables each said appliance to contribute to collecting the information from a specific one of the managed devices that a given one of the appliances is communicating with.

14. The system of claim 13, wherein each said appliance further comprises:
an interface for interfacing the appliance to the at least one managed device, the interface including:
a serial interface port;
a universal serial bus (USB) interface port;
a video interface port; and
a plurality of additional RDU input ports that form a portion of the RDU subsystem, and which receive inputs from the plurality of remotely located sensors, and wherein the remotely located sensors generate signals indicative of at least one of:
a condition of an environment in which the at least one managed device is located; and
an operational state of the managed device.

15. The system of claim 13, further comprising at least one autosensing power supply adapted to sense when a loss of power to a rack interface pod coupled to the appliance occurs, where the rack interface pod is interfacing the appliance to the at least one managed device, and to automatically apply direct current (DC) power to the rack interface pod to maintain the rack interface pod in a powered on condition.

16. The system of claim 14, wherein the interface includes a plurality of autosensing ports adapted to automatically sense whether one of the external managed devices coupled thereto is a serial device or an Ethernet device.

17. A method for enabling communications between a plurality of managed devices and a user located remotely from the managed devices, the method comprising:
using a plurality of appliances, each said appliance having a processor housed within a housing of the appliance and adapted to facilitate communication of keyboard, video and mouse information between the appliance and at least one of the managed devices;
using a manageability subsystem included in each one of the appliances to collect data from the managed devices for analysis, and wherein a transmission of the collected data from the managed devices to each one of the appliances occurs via direct connections with the managed devices which do not involve the use of a network;
using a rack data unit (RDU) subsystem having an RDU port on each one of the appliances to connect via a direct cable connections with sensor outputs of the managed devices, to receive sensor data from sensors associated with the managed devices; and
wherein the appliances of the system collectively form a distributed manageability subsystem configuration that enables each said appliance to contribute to collecting the information from a specific one of the managed devices that a given one of the appliances is communicating with.

18. A system including a plurality of remote access appliances for facilitating communications between a plurality of managed devices and at least one user located remotely from the appliances and the managed devices, each said appliance comprising:
a housing;
a processor housed within the housing and adapted to facilitate communication of keyboard, video and mouse information between the appliance and at least one managed device in communication with the appliance;
a manageability subsystem housed within the housing for communicating with the at least one managed device and collecting information concerning operation of the at least one managed device via a communication link, and where the communication link does not involve the use of a network;
a rack data unit (RDU) subsystem housed within the housing and including one RDU port enabling a direct communication link via a cable with a sensor output of a sensor associated with one of the managed devices;
the manageability subsystem including an element library that stores parameters associated with the managed device; and
wherein the appliances of the system collectively form a distributed manageability subsystem configuration that enables each said appliance to contribute to collecting the information from a specific one of the managed devices that a given one of the appliances is communicating with.

* * * * *